US008431986B2

(12) United States Patent
Kujirai

(10) Patent No.: US 8,431,986 B2
(45) Date of Patent: Apr. 30, 2013

(54) SEMICONDUCTOR DEVICE HAVING THREE-DIMENSIONAL TRANSISTOR AND MANUFACTURING METHOD THEREOF

(75) Inventor: Hiroshi Kujirai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 283 days.

(21) Appl. No.: 13/022,640

(22) Filed: Feb. 8, 2011

(65) Prior Publication Data

US 2011/0193159 A1    Aug. 11, 2011

(30) Foreign Application Priority Data

Feb. 8, 2010   (JP) ................................. 2010-025970

(51) Int. Cl.
*H01L 27/088* (2006.01)
(52) U.S. Cl.
USPC ........... 257/329; 257/331; 257/124; 257/368; 257/330; 257/E27.06
(58) Field of Classification Search .................. 257/329, 257/331, 124, 368, 330, E27.06
See application file for complete search history.

(56) References Cited

U.S. PATENT DOCUMENTS

| 8,039,896 B2 * | 10/2011 | Seo et al. ........................ 257/331 |
| 8,217,435 B2 * | 7/2012 | Chang et al. ................... 257/288 |
| 2008/0296671 A1 * | 12/2008 | Takaishi ......................... 257/330 |
| 2009/0129145 A1 * | 5/2009 | Slesazeck ....................... 365/174 |
| 2009/0213648 A1 * | 8/2009 | Slesazeck ....................... 365/180 |

FOREIGN PATENT DOCUMENTS

JP    2009-010366    1/2009

* cited by examiner

*Primary Examiner* — Victor A Mandala
(74) *Attorney, Agent, or Firm* — Young & Thompson

(57) ABSTRACT

A semiconductor device includes a silicon pillar formed substantially perpendicular to a principal surface of a silicon substrate, a first impurity diffusion layer and a second impurity diffusion layer arranged below and above the silicon pillar, respectively, a gate electrode arranged to penetrate through the silicon pillar in a horizontal direction, a gate dielectric film arranged between the gate electrode and the silicon pillar, a back-gate electrode arranged adjacent to the silicon pillar, and a back-gate dielectric film arranged between the back-gate electrode and the silicon pillar.

5 Claims, 35 Drawing Sheets

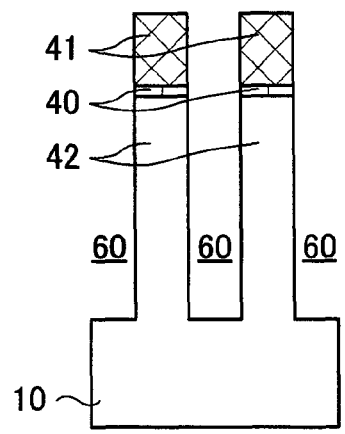 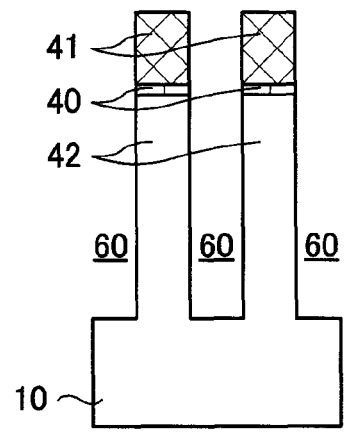
FIG.6A  FIG.6B
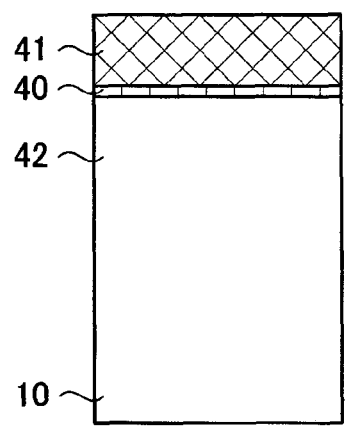 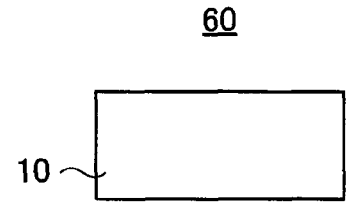
FIG.6C  FIG.6D

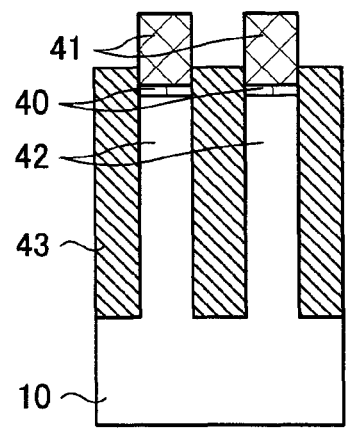 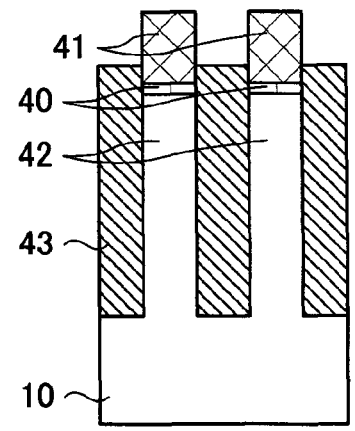
FIG.8A   FIG.8B
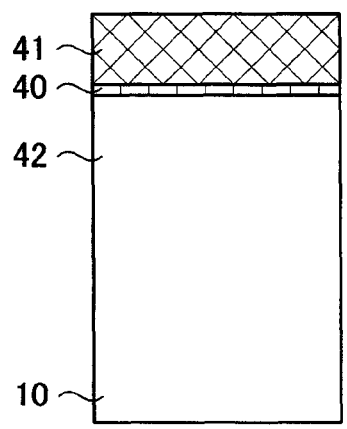 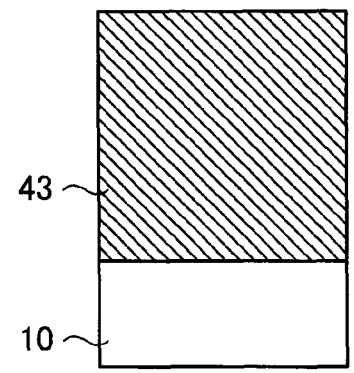
FIG.8C   FIG.8D

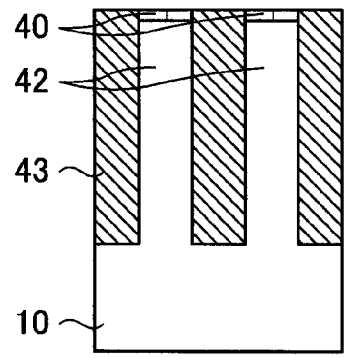
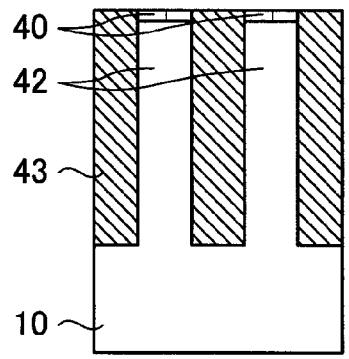
FIG.10A      FIG.10B
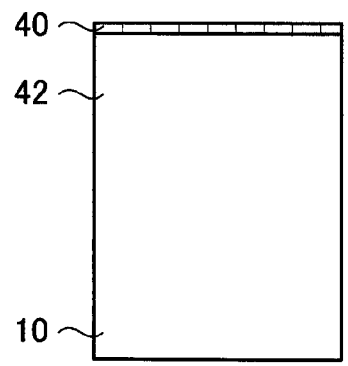
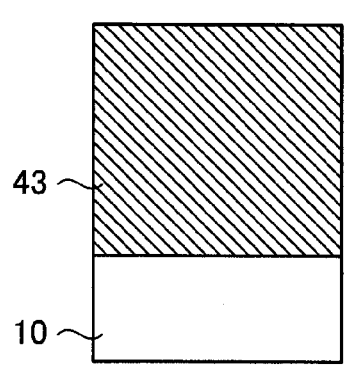
FIG.10C      FIG.10D

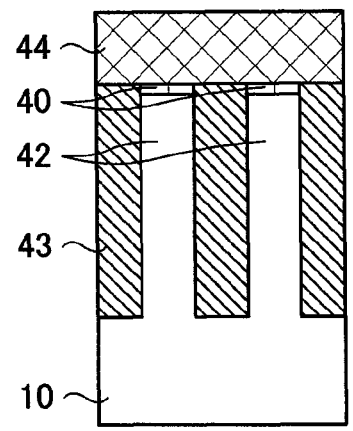 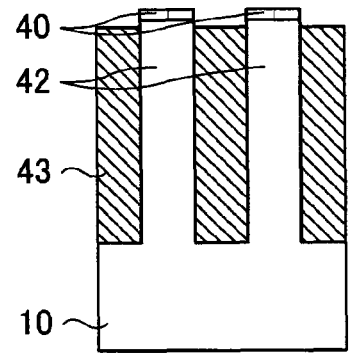
FIG.12A  FIG.12B
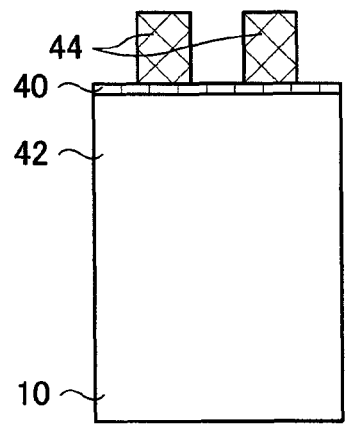 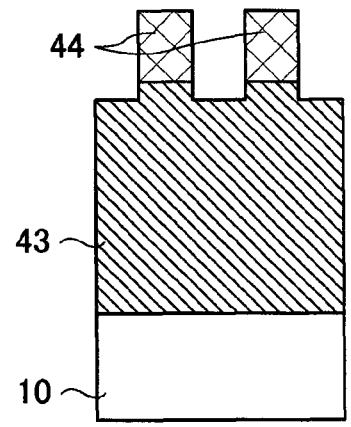
FIG.12C  FIG.12D

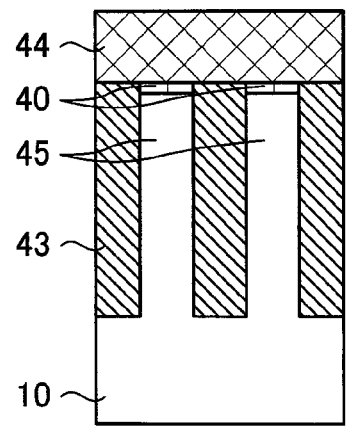
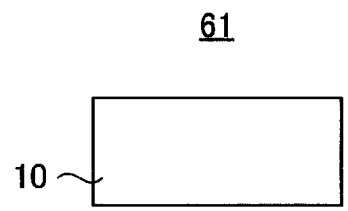
FIG.14A  FIG.14B
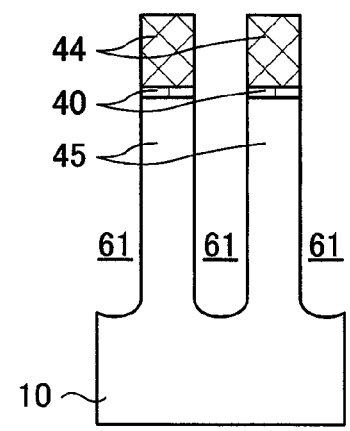
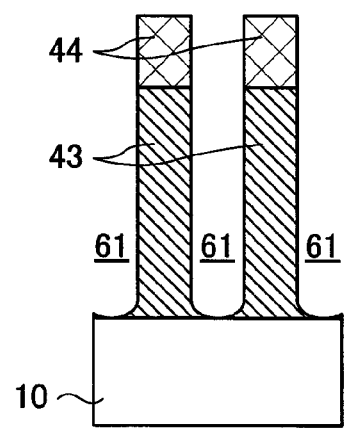
FIG.14C  FIG.14D

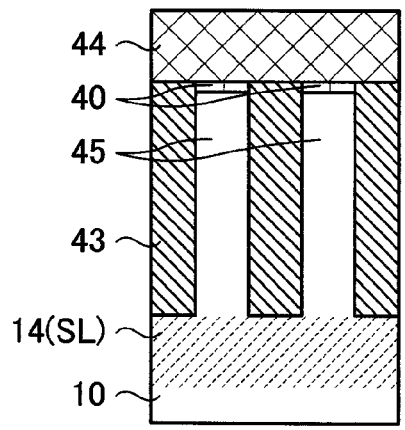 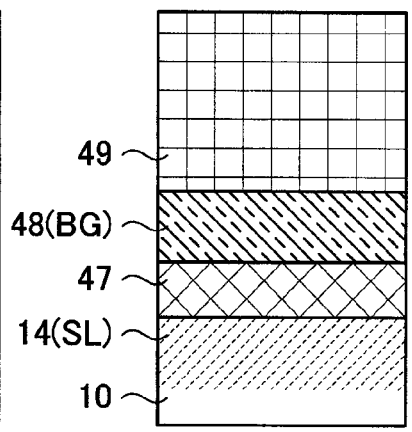
FIG.18A   FIG.18B
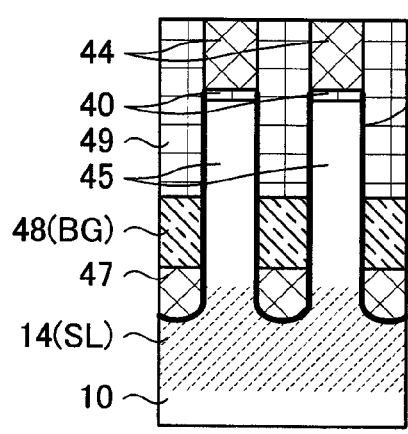 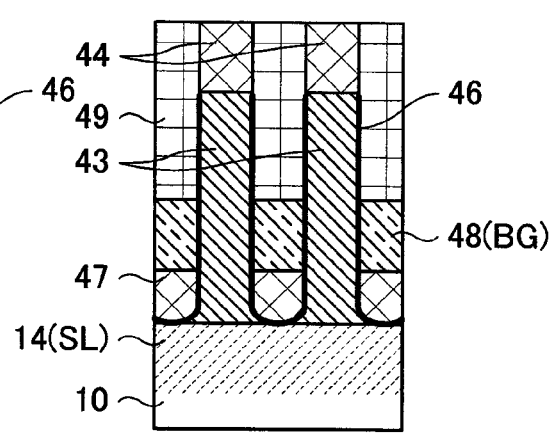
FIG.18C   FIG.18D

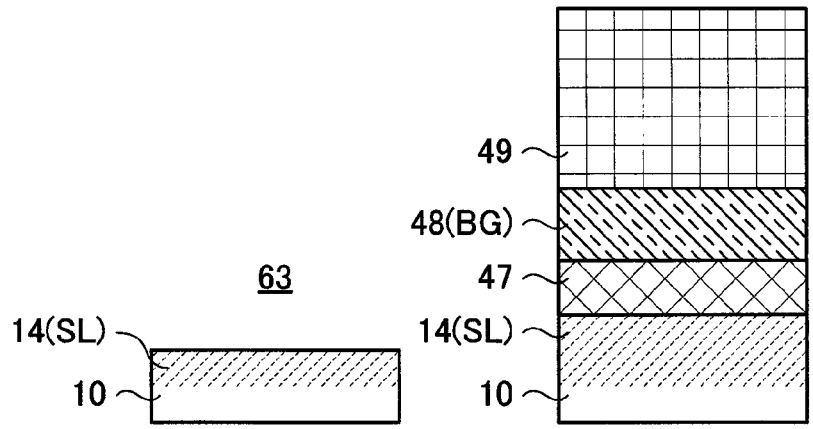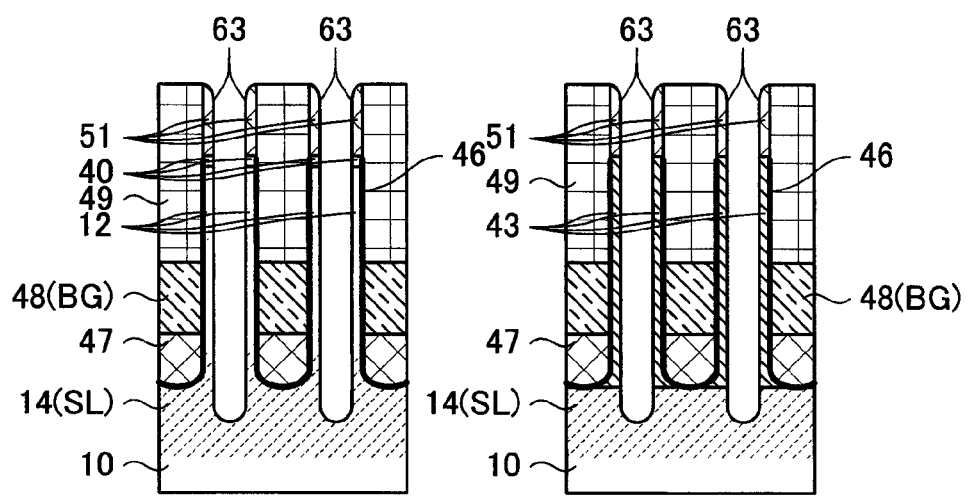
FIG.22A  FIG.22B  FIG.22C  FIG.22D

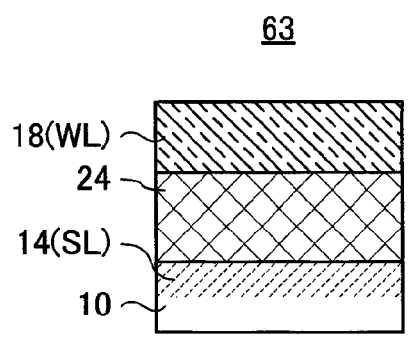 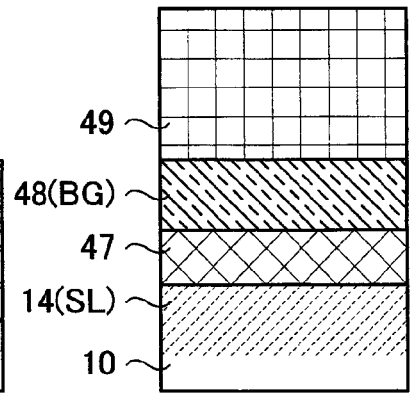
FIG.24A  FIG.24B
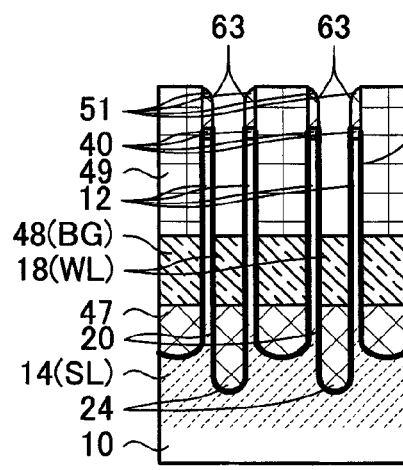 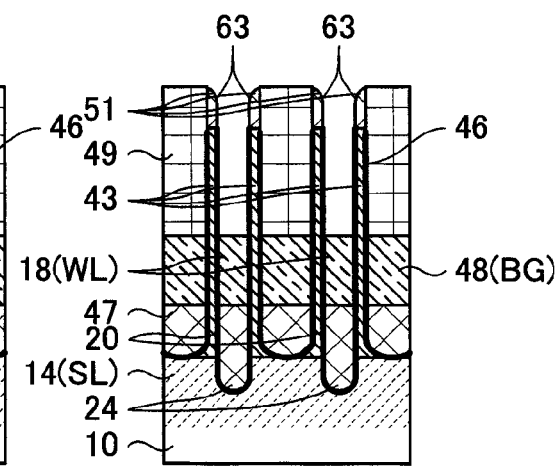
FIG.24C  FIG.24D

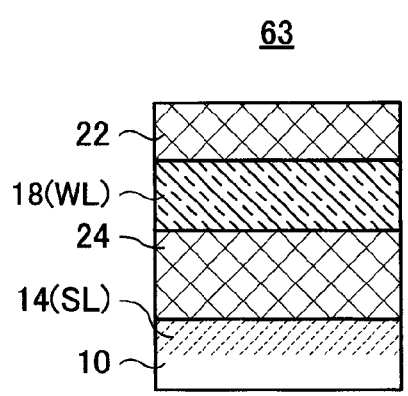 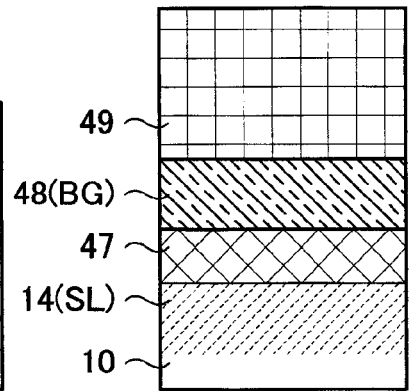
FIG.26A  FIG.26B
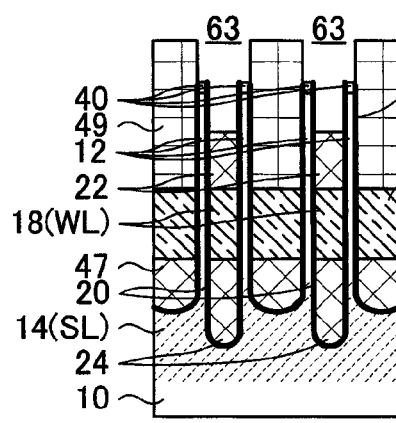 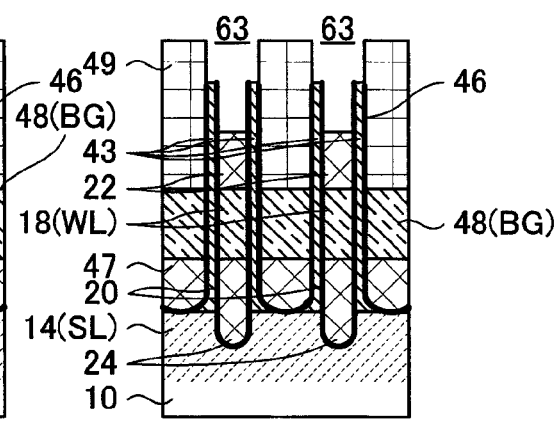
FIG.26C  FIG.26D

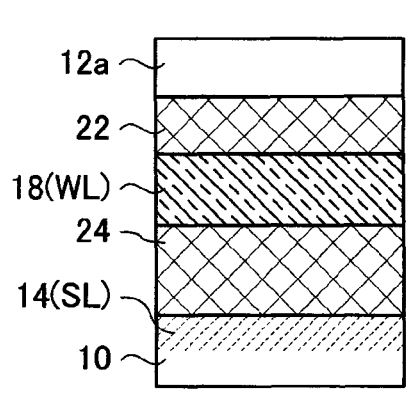 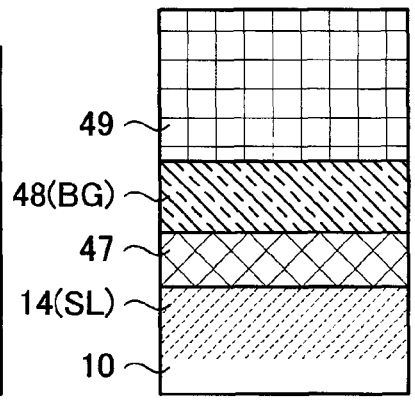
FIG.28A  FIG.28B
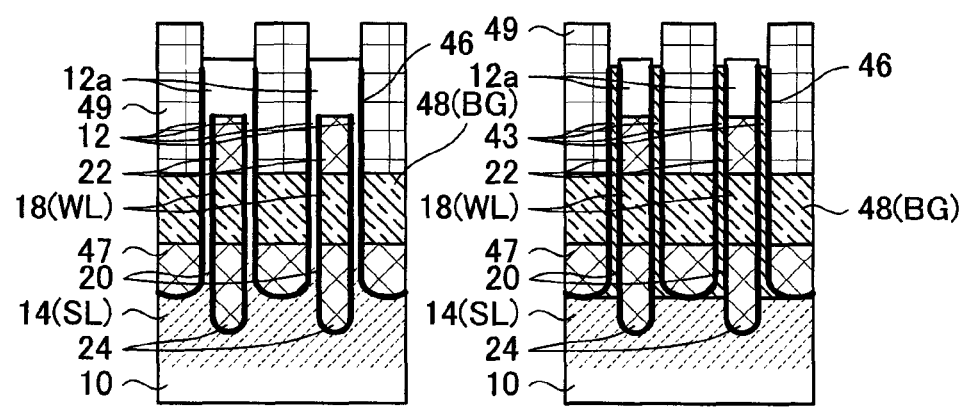
FIG.28C  FIG.28D

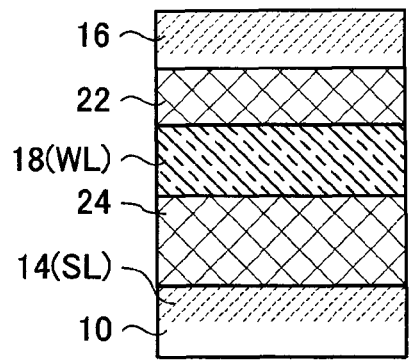
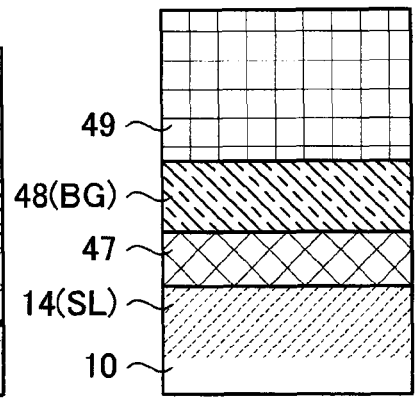
FIG.30A  FIG.30B
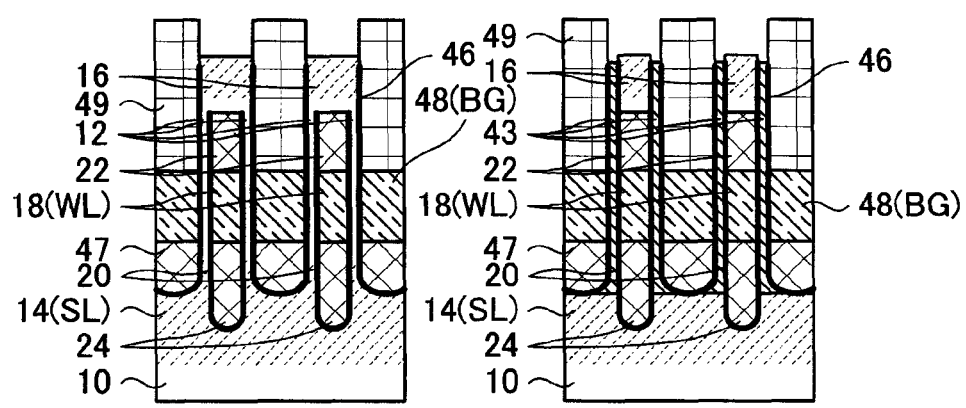
FIG.30C  FIG.30D

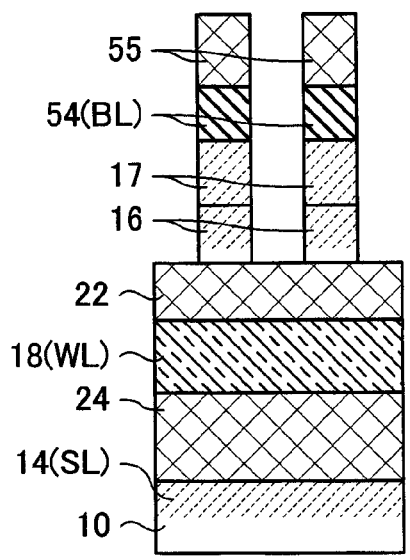 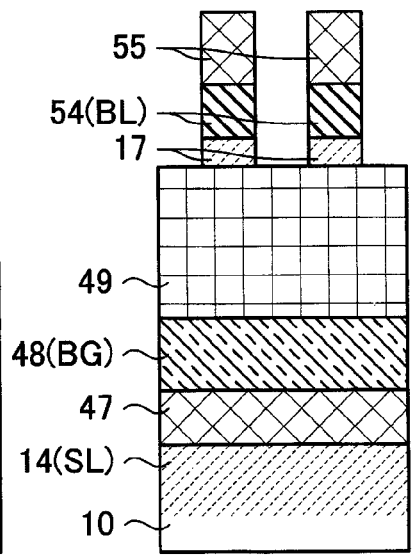
FIG.32A  FIG.32B
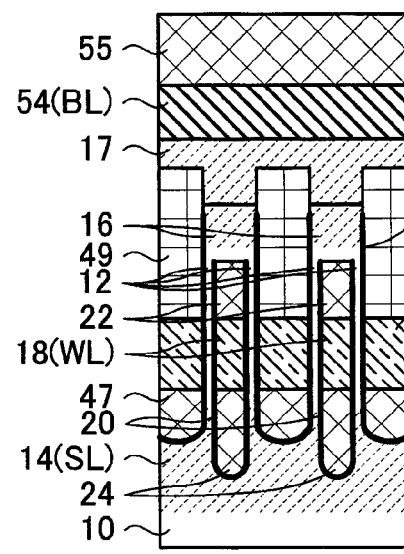 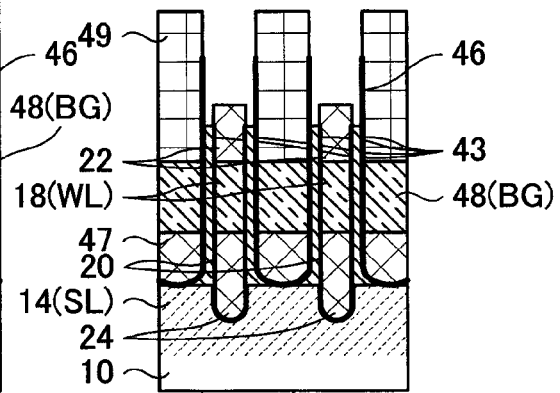
FIG.32C  FIG.32D

US 8,431,986 B2

SEMICONDUCTOR DEVICE HAVING THREE-DIMENSIONAL TRANSISTOR AND MANUFACTURING METHOD THEREOF

BACKGROUND OF THE INVENTION

1. Field of the Invention

The present invention relates to a semiconductor device and a manufacturing method thereof, and more particularly relates to a semiconductor device using three-dimensionally formed transistors or thyristors and a manufacturing method of the semiconductor device.

2. Description of Related Art

Improvement in an integration degree of semiconductor devices has so far been primarily achieved by downsizing of transistors. However, the downsizing of the transistors has become almost to the maximum possible extent, and any further downsizing is likely to hamper correct operations of the semiconductor devices due to the short channel effect or the like.

As a fundamental solution to such a problem, a method has been proposed by which a semiconductor substrate is subjected to three-dimensional processing to form the transistor three-dimensionally. Particularly, a type of three-dimensional transistor in which a silicon pillar that extends perpendicular to a principal surface of the semiconductor substrate is used as a channel, has advantages of having a smaller occupied space and a larger drain current due to complete depletion. This type of transistor can also realize a close-packed layout of 4 $F^2$ (F is the minimum processing dimension) (see Japanese Patent Application Laid-open No. 2009-010366).

Among these semiconductor devices, particularly in a DRAM (Dynamic Random Access Memory), capacitors are typically used for storing information. However, with the improvement in the integration degree, downsizing of the capacitor has also become imperative, resulting in difficulty in securing an adequate capacitance from the capacitor. Therefore, in recent years, there have been proposed capacitorless DRAMs that store information in thyristors or transistors instead of capacitors. An example of such a capacitorless DRAM that stores information in three-dimensionally formed thyristors is disclosed in United States Patent Publication No. 2009/0213648.

Meanwhile, in the semiconductor devices that use three-dimensionally formed thyristors or transistors for storing information, an amount of electric charge accumulated therein is smaller than that of conventional devices due to downsizing. Therefore, the influence of a leakage current on information retention characteristics increases, and it becomes necessary to reduce the leakage current of the thyristors or transistors.

SUMMARY

In one embodiment, there is provided a semiconductor device comprising: a silicon pillar formed substantially perpendicular to a principal surface of a substrate; a first impurity diffusion layer and a second impurity diffusion layer arranged below and above the silicon pillar, respectively; a gate electrode that penetrates through the silicon pillar in a horizontal direction; a gate dielectric film arranged between the gate electrode and the silicon pillar; a back-gate electrode arranged adjacent to the silicon pillar; and a back-gate dielectric film arranged between the back-gate electrode and the silicon pillar.

In another embodiment, there is provided a manufacturing method of a semiconductor device, comprising: forming a silicon pillar by etching a silicon substrate using a mask insulating film; forming a back-gate dielectric film by oxidizing a side face of the silicon pillar; forming a first impurity diffusion layer below the silicon pillar; forming a back-gate electrode, with at least a topside thereof covered by a first insulating film, around the silicon pillar; removing the mask insulating film; forming a side-wall dielectric film on an inner wall of a first opening formed by removing the mask insulating film; etching the silicon pillar using the side-wall dielectric film and the first insulating film as masks; forming a gate dielectric film by oxidizing an inner wall of a second opening formed by etching the silicon pillar; forming a gate electrode, with at least a topside thereof covered by a second insulating film, inside the second opening; and forming a second impurity diffusion layer in contact with a top of the silicon pillar and a top of the second insulating film.

According to the present invention, a crystal defect count is reduced by reducing a volume of a silicon pillar. Accordingly, a leakage current of a thyristor or a transistor formed inside the silicon pillar can be reduced. In addition, because a double-gate thyristor or a double-gate transistor is employed, an accumulable charge of the thyristor or the transistor can be increased, and thus an information retention time can be increased.

BRIEF DESCRIPTION OF THE DRAWINGS

The above features and advantages of the present invention will be more apparent from the following description of certain preferred embodiments taken in conjunction with the accompanying drawings, in which:

FIGS. 6A to 6D are cross-sectional views taken along a line A-A, a line B-B, a line C-C, and a line D-D, respectively, of FIG. 5;

FIGS. 8A to 8D are cross-sectional views taken along a line A-A, a line B-B, a line C-C, and a line D-D, respectively, of FIG. 7;

FIGS. 10A to 10D are cross-sectional views taken along a line A-A, a line B-B, a line C-C, and a line D-D, respectively, of FIG. 9;

FIGS. 12A to 12D are cross-sectional views taken along a line A-A, a line B-B, a line C-C, and a line D-D, respectively, of FIG. 11;

FIGS. 14A to 14D are cross-sectional views taken along a line A-A, a line B-B, a line C-C, and a line D-D, respectively, of FIG. 13;

FIGS. 18A to 18D are cross-sectional views taken along a line A-A, a line B-B, a line C-C, and a line D-D, respectively, of FIG. 17;

FIGS. 22A to 22D are cross-sectional views taken along a line A-A, a line B-B, a line C-C, and a line D-D, respectively, of FIG. 21;

FIGS. 24A to 24D are cross-sectional views taken along a line A-A, a line B-B, a line C-C, and a line D-D, respectively, of FIG. 23;

FIGS. 26A to 26D are cross-sectional views taken along a line A-A, a line B-B, a line C-C, and a line D-D, respectively, of FIG. 25;

FIGS. 28A to 28D are cross-sectional views taken along a line A-A, a line B-B, a line C-C, and a line D-D, respectively, of FIG. 27;

FIGS. 30A to 30D are cross-sectional views taken along a line A-A, a line B-B, a line C-C, and a line D-D, respectively, of FIG. 29;

FIGS. 32A to 32D are cross-sectional views taken along a line A-A, a line B-B, a line C-C, and a line D-D, respectively, of FIG. 31;

DETAILED DESCRIPTION OF THE EMBODIMENTS

Preferred embodiments of the present invention will be explained below in detail with reference to the accompanying drawings.

Figure 1:
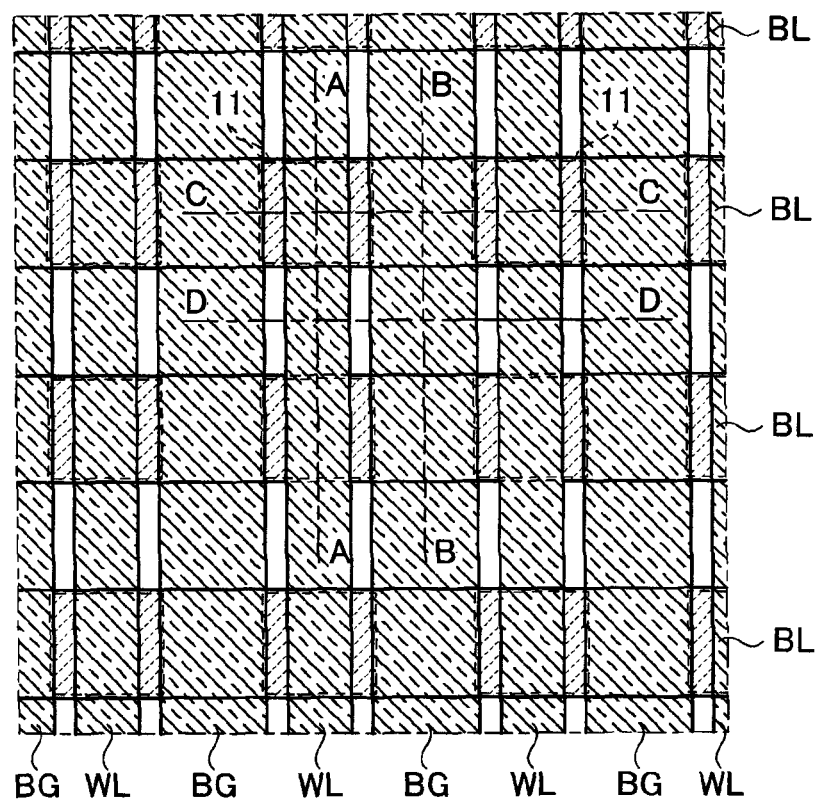
FIG. 1 is a plan view of a semiconductor device according to a first embodiment of the present invention.

FIG. 1 is a plan view of a semiconductor device 1 according to a first embodiment of the present invention. Positions of word lines WL, bit lines BL, and back-gate lines BG, which are not seen on the surface in practice, are also shown in FIG. 1. FIGS. 2A to 2D are cross-sectional views taken along a line A-A, a line B-B, a line C-C, and a line D-D, respectively, of FIG. 1.

The semiconductor device 1 according to the first embodiment is a so-called capacitorless semiconductor memory device (DRAM) that does not use a memory cell capacitor, and is formed inside a P-type (second conductivity type) area PWELL (not shown) arranged on a surface of a silicon substrate 10 and above the area PWELL.

As shown in FIG. 1, the semiconductor device 1 includes a plurality of the word lines WL that extend longitudinally, and a plurality of the bit lines BL that extend crosswise in FIG. 1. The back-gate lines BG are interspersed between the word lines WL. There is a gap of 2 F (a distance between centers) between adjacent word lines WL and adjacent bit lines BL. Thyristors 11 are arranged at intersections between the word lines WL and the bit lines BL.

The thyristor 11 is formed by a silicon pillar 12 formed substantially perpendicular to a principal surface of the silicon substrate 10.

The thyristor 11 is a four-layer element having two layers each of alternating N-type impurity diffusion layer and P-type impurity diffusion layer sequentially from the bottom of the silicon pillar 12. These four layers correspond to the following areas in FIG. 2C: a first impurity diffusion layer 14 below each of the silicon pillars 12 corresponds to the bottom-most N-type impurity diffusion layer; the area (PWELL) inside the silicon pillar 12 above the first impurity diffusion layer 14 corresponds to the P-type impurity diffusion layer second from the bottom; a second impurity diffusion layer 16 above the area (PWELL) inside the silicon pillar 12 corresponds to the N-type impurity diffusion layer third from the bottom; and a third impurity diffusion layer 17 arranged in contact with the top of the second impurity diffusion layer 16 corresponds to the topmost P-type impurity diffusion layer.

The first impurity diffusion layer 14 that corresponds to the bottom-most N-type impurity diffusion layer is formed by diffusing N-type impurities into the silicon. The first impurity diffusion layer 14 is also diffused into the silicon substrate 10, as shown in FIGS. 2A to 2D, and connects between adjacent silicon pillars 12, forming a source line SL that commonly connects all the thyristors 11.

Figure 2A:
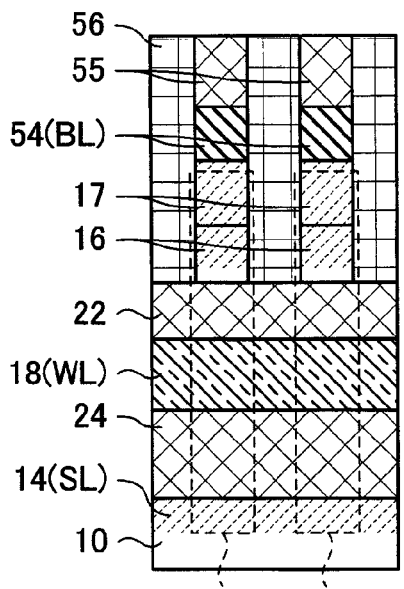
FIGS. 2A to 2D are cross-sectional views taken along a line A-A, a line B-B, a line C-C, and a line D-D, respectively, of FIG. 1.
Figure 2B:
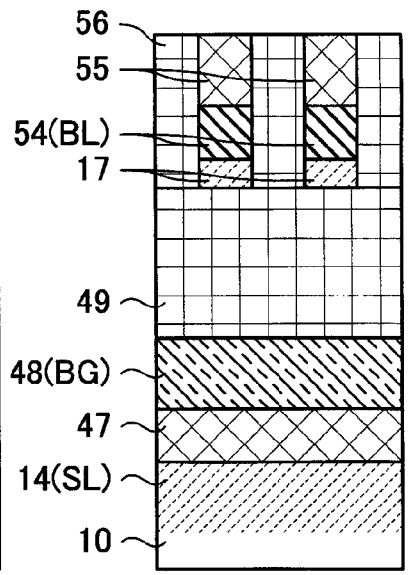
Figure 2C:
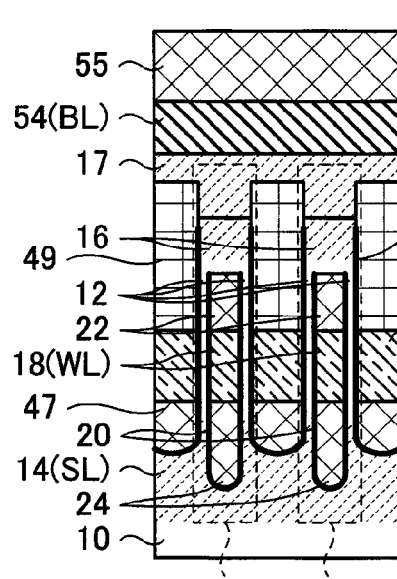
Figure 2D:
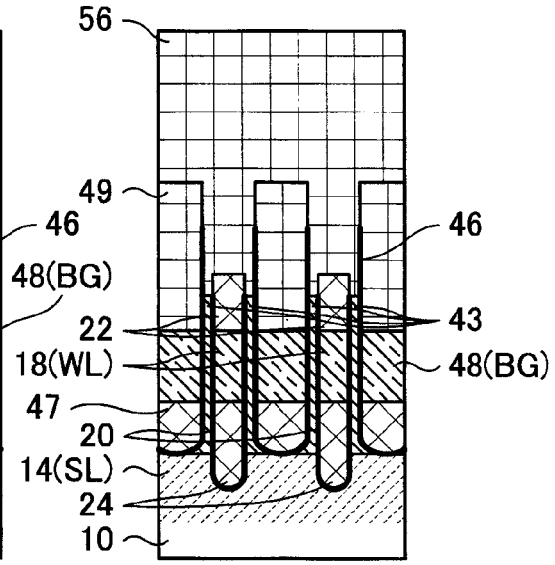

In the area inside the silicon pillar 12 that corresponds to the P-type impurity diffusion layer that is second from the bottom, the silicon pillar 12 is split into two portions with each portion lying on either side of a central line along a word line direction. As shown in FIG. 2C, between the split portions, a gate electrode 18 (the word line WL) is arranged. It can be also said that the word line WL is arranged to penetrate through the silicon pillar 12 in a horizontal direction (a word line direction). A relatively thin gate dielectric film 20 is arranged between a side face of the gate electrode 18 and an inner wall face of the silicon pillar 12. Relatively thick insulating films 22 and 24 are provided on an upper face and a lower face, respectively, of the gate electrode 18. The insulating films 22 and 24 are provided with an objective of reducing a GIDL (Gate Induced Drain Leakage) and a GISL (Gate Induced Source Leakage), respectively.

In addition to the gate electrode 18 (the word line WL), the thyristor 11 also includes a back-gate electrode 48 (the back-gate line BG). That is, the thyristor 11 is a double-gate thyristor. The back-gate line BG is arranged adjacent to the P-type impurity diffusion layer that is second from the bottom. In other words, the back-gate BG is arranged between the adjacent silicon pillars 12. A relatively thin back-gate dielectric film 46 is arranged between a side face of the back-gate electrode 48 and an outer wall face of the silicon pillar 12. Relatively thick insulating films 47 and 49 are provided on an upper face and a lower face of the back-gate electrode 48, respectively.

The second impurity diffusion layer 16 that corresponds to the N-type impurity diffusion layer that is third from the bottom is formed by diffusing N-type impurities into the silicon. An independent second impurity diffusion layer 16 is provided for every silicon pillar 12.

The third impurity diffusion layer 17 that corresponds to the topmost P-type impurity diffusion layer, is formed by diffusing P-type impurities into the silicon. As shown in FIGS. 2A to 2C, the third impurity diffusion layer 17 is continuous between the adjacent silicon pillars 12 in a bit line direction. The bit line BL is constituted by a laminated film 54 (WN/W film) made of tungsten nitride (WN) and tungsten (W) that is formed in contact with the top of the third impurity diffusion layer 17. A silicon nitride film 55 is formed above the bit line BL.

As shown in FIG. 2A, the second impurity diffusion layer 16, the third impurity diffusion layer 17, the laminated film 54 (the bit line BL), and the silicon nitride film 55 are provided to penetrate through an inter-layer dielectric film 56 formed of silicon dioxide ($SiO_2$) or the like in a vertical direction. The inter-layer dielectric film 56 has a function of electrically separating the above-mentioned layers (films) between the adjacent thyristors 11 in a word line direction.

Figure 3:
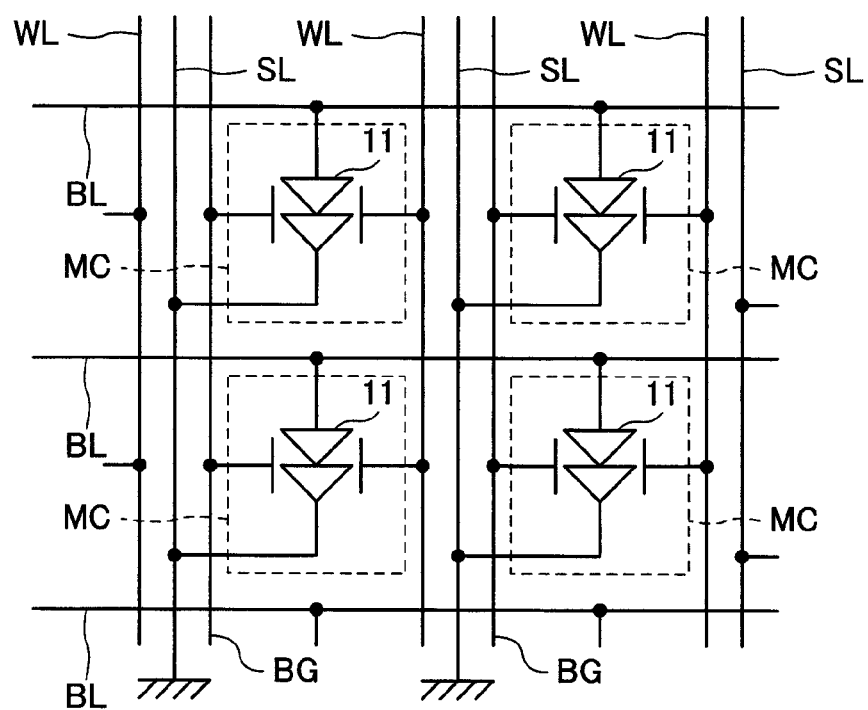
FIG. 3 is an equivalent circuit diagram of the semiconductor device according to the first embodiment of the present invention.

FIG. 3 is an equivalent circuit diagram of the semiconductor device 1 according to the first embodiment. However, only four memory cells have been shown exposed in FIG. 3. The semiconductor device 1 according to the first embodiment includes four types of wirings, that is, the word lines WL, the bit lines BL, the back-gate lines BG, and the source lines SL, and has a memory cell that includes the thyristor 11 at each intersection between the word lines WL and the bit lines BL. The bit line BL is connected to an anode of the thyristor 11 and the source line SL is connected to a cathode of the thyristor 11. The source line SL is connected to the ground. The word line WL and the back-gate line BG form a gate electrode and a back-gate electrode, respectively, of the thyristor 11 that are of a double-gate type.

According to the above configuration, by a combination of voltages applied to the word line WL and the bit line BL, electric charge can be made to accumulate in or accumulated electric charge amount can be read from the P-type impurity diffusion layer that is second from the bottom (an area in the middle of the silicon pillar 12) in the thyristor 11 within a specific memory cell. That is, writing to and reading from the thyristor 11 can be performed.

Figure 4:
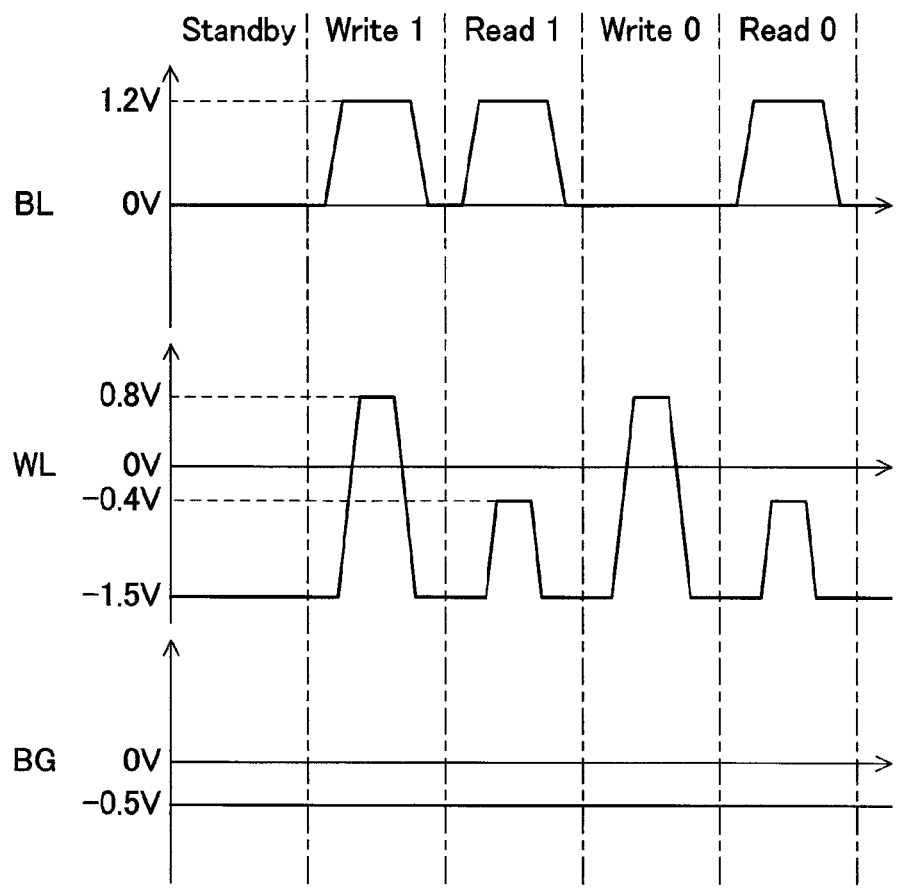
FIG. 4 shows a change in electric potentials of the bit line BL, the word line WL, and the back-gate line BG according to the first embodiment of the present invention.
Figure 5:
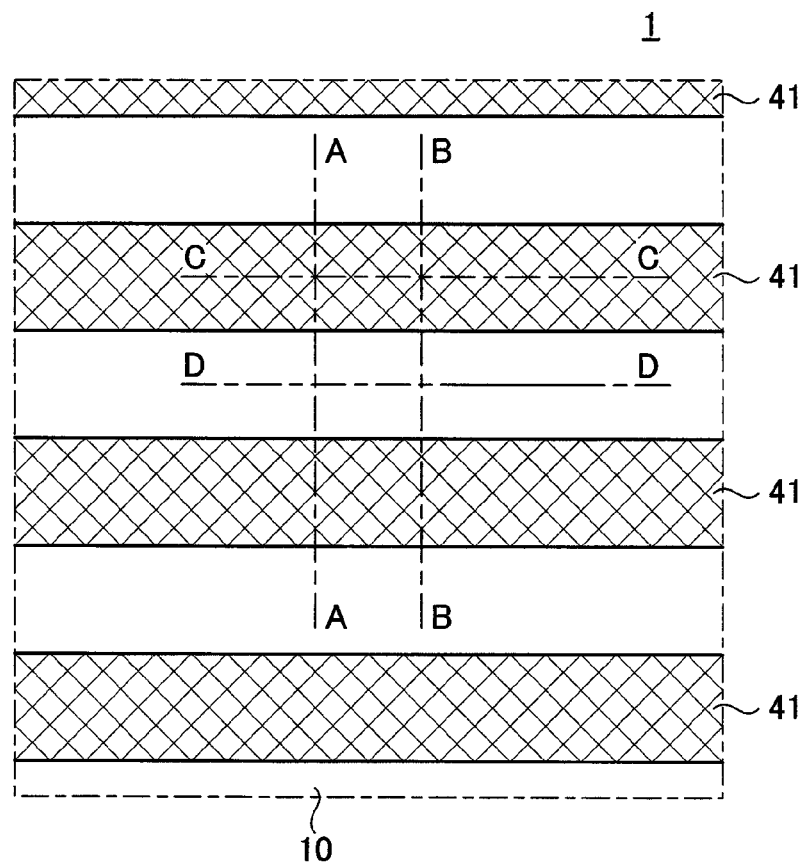
FIGS. 5, 7, 9, 11, 13, 15, 17, 19, 21, 23, 25, 27, 29, 31 are plan views of the semiconductor device according to the first embodiment and show a manufacturing process of the semiconductor device.
Figure 7:
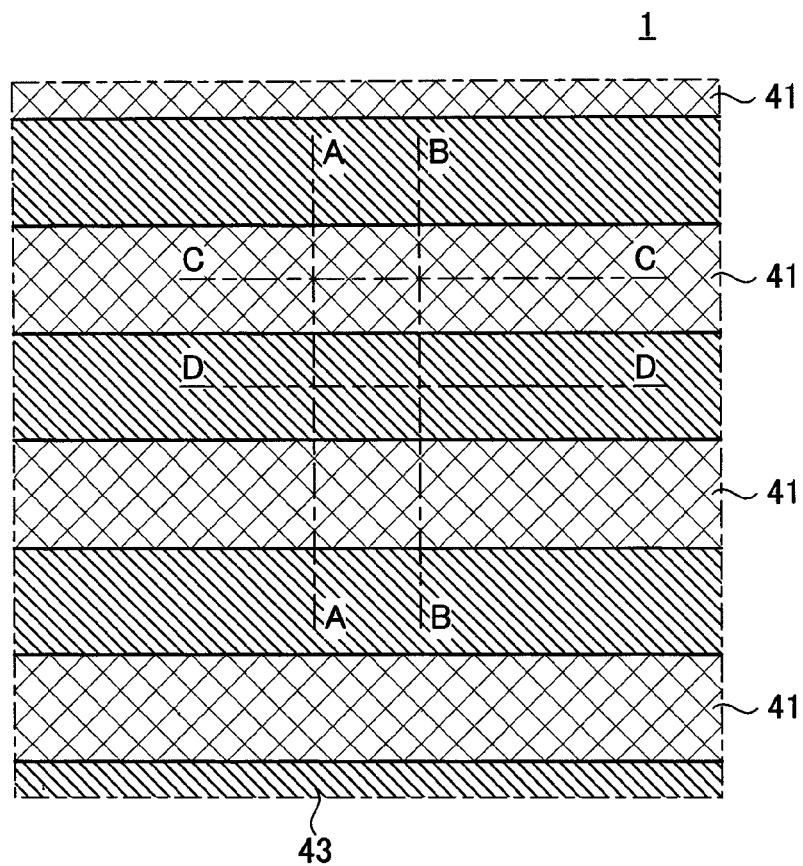
Figure 9:
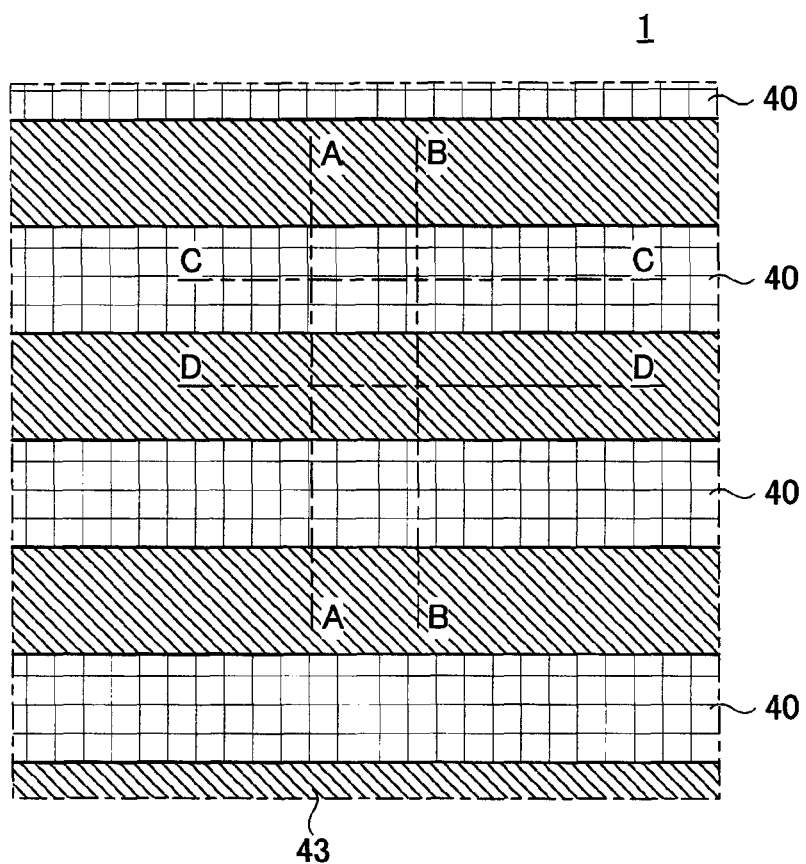
Figure 11:
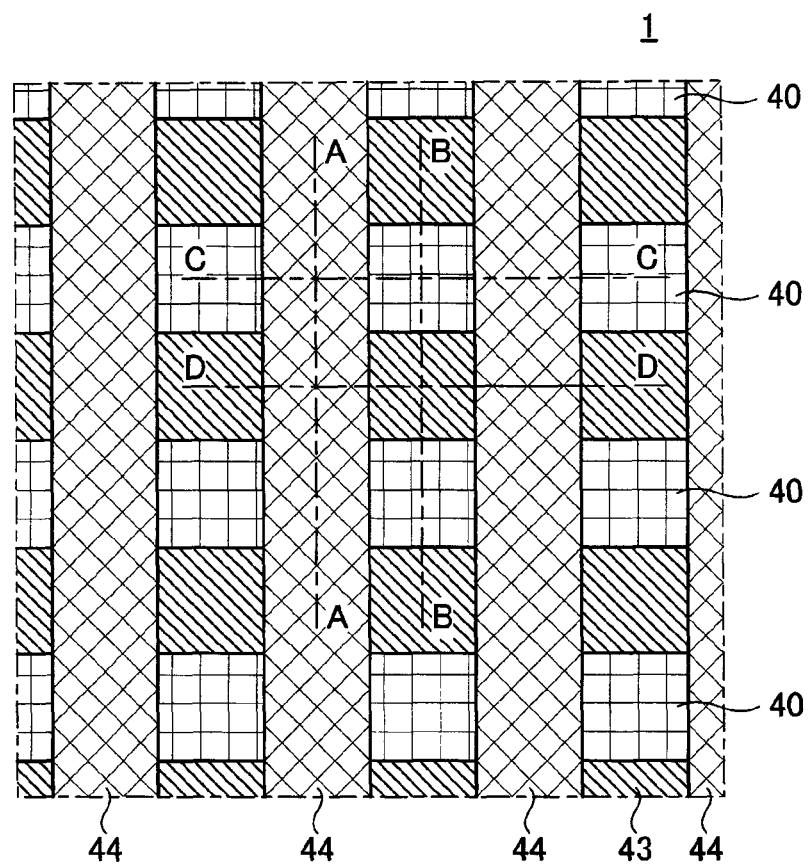
Figure 13:
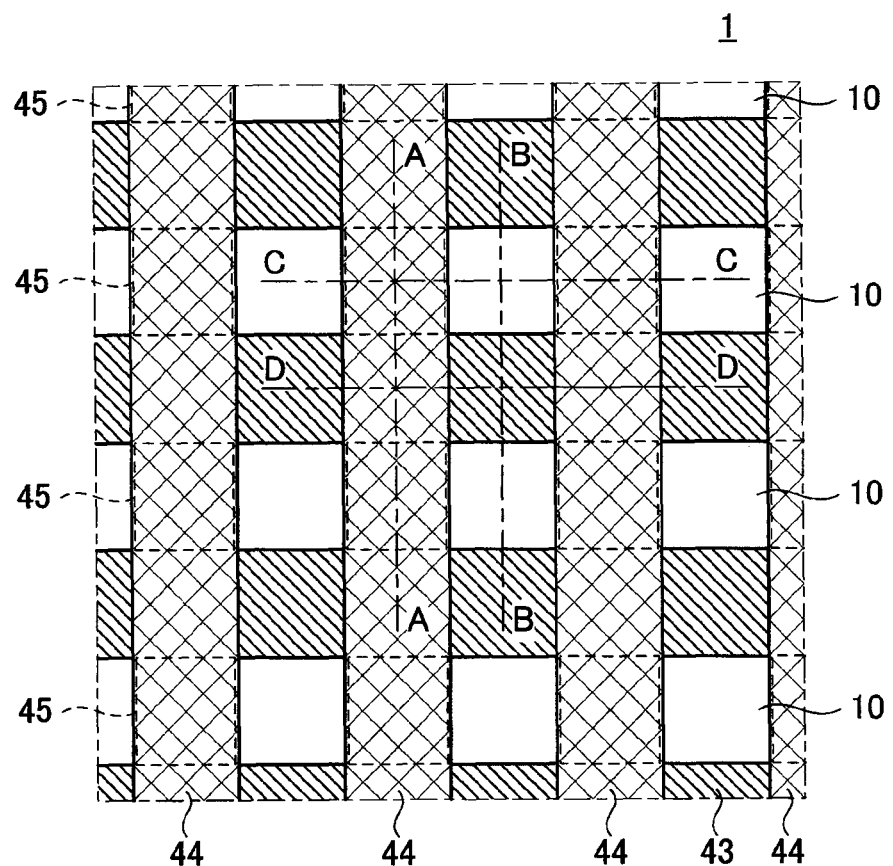
Figure 15:
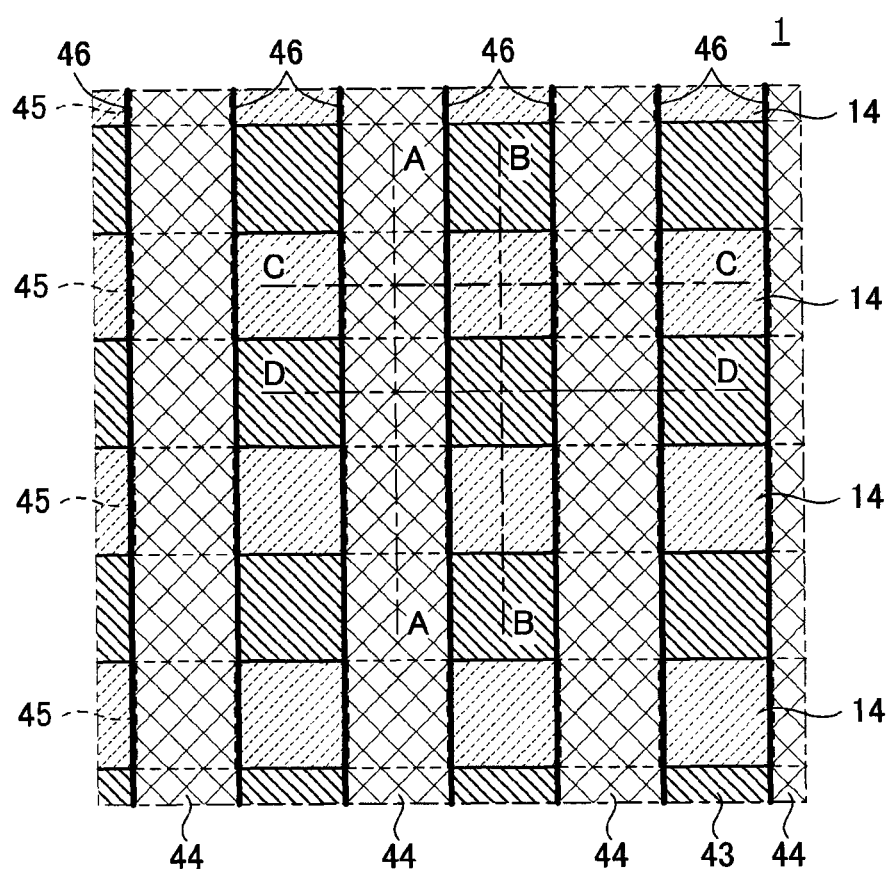
Figures 16A, 16B:
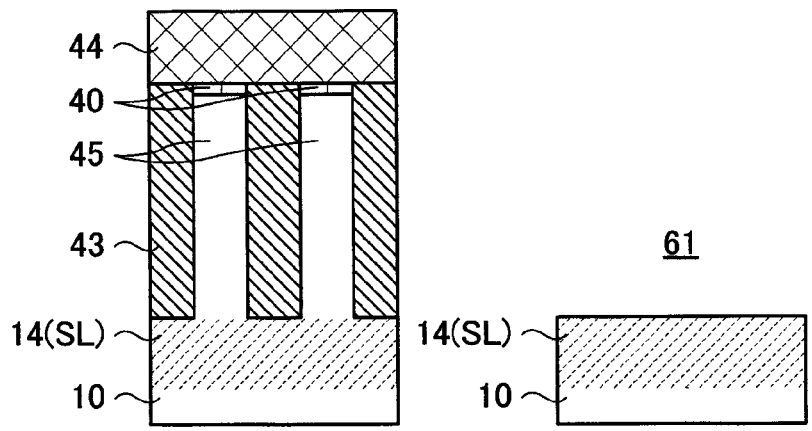
FIGS. 16A to 16D are cross-sectional views taken along a line A-A, a line B-B, a line C-C, and a line D-D, respectively, of FIG. 15.
Figures 16C, 16D:
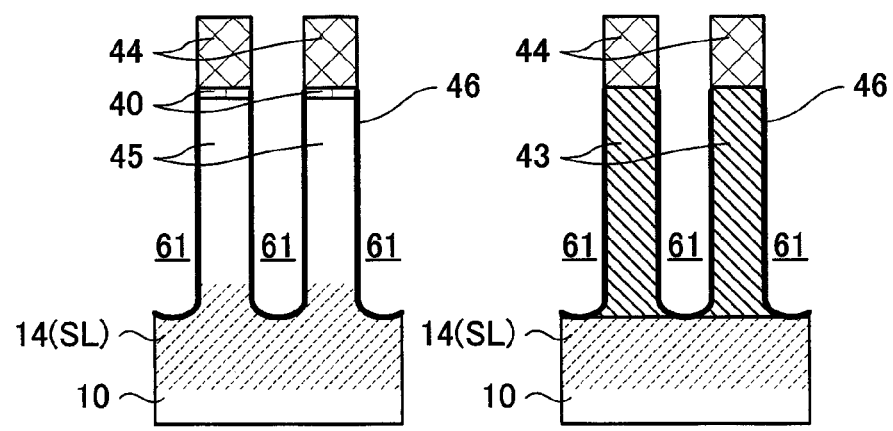
Figure 17:
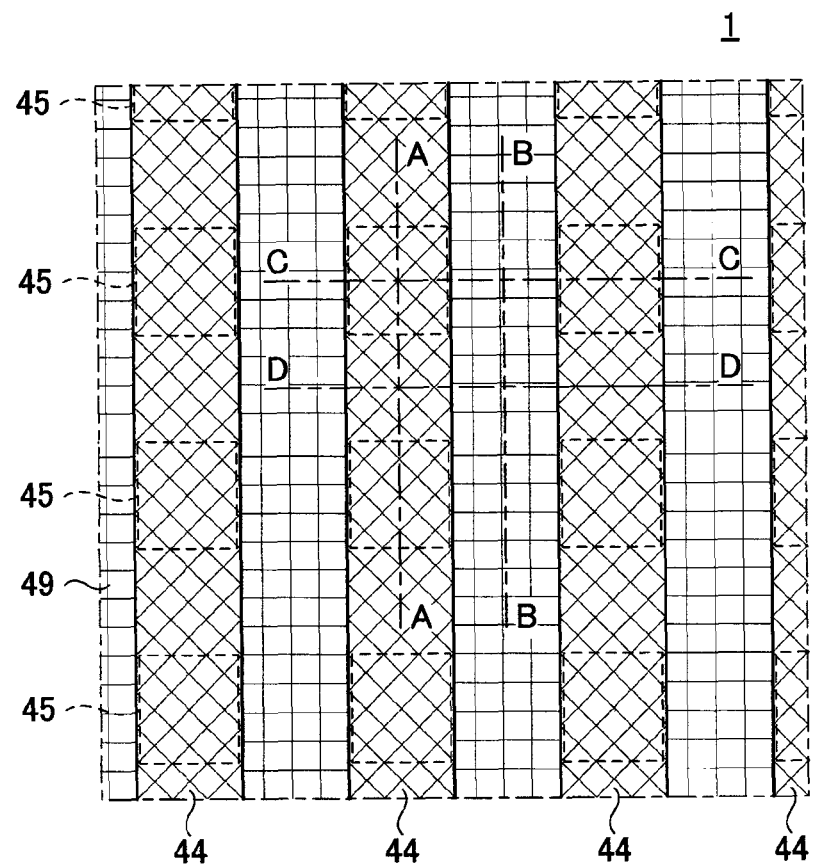
Figure 19:
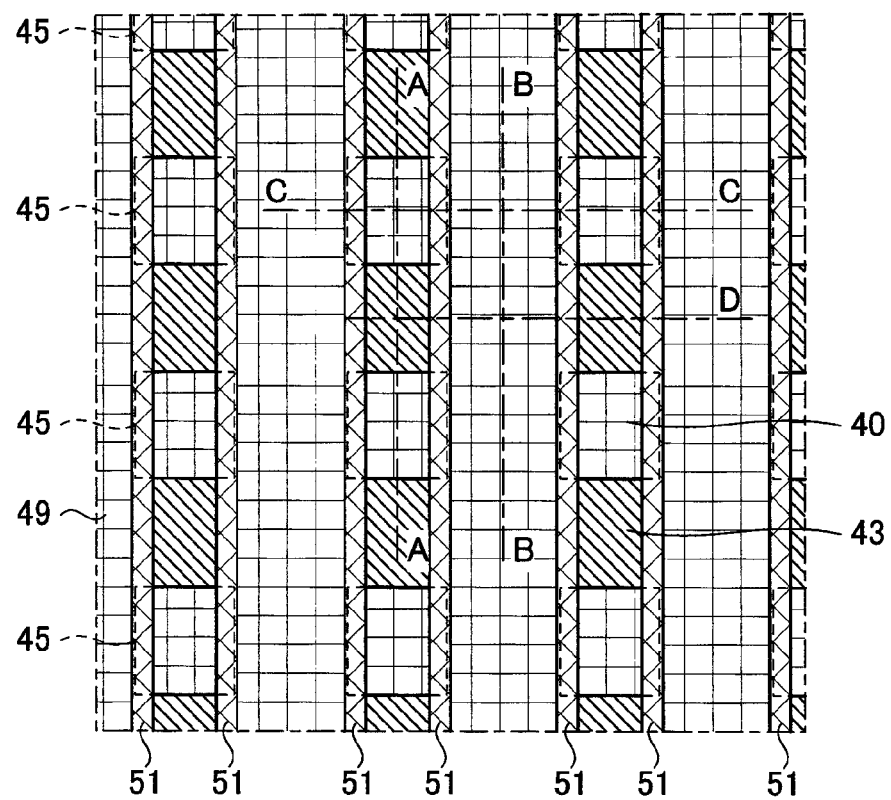
Figure 20A:
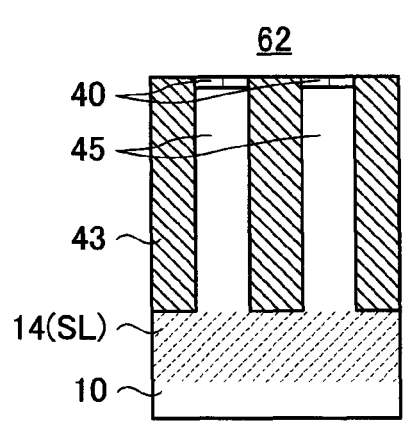
FIGS. 20A to 20D are cross-sectional views taken along a line A-A, a line B-B, a line C-C, and a line D-D, respectively, of FIG. 19.
Figure 20B:
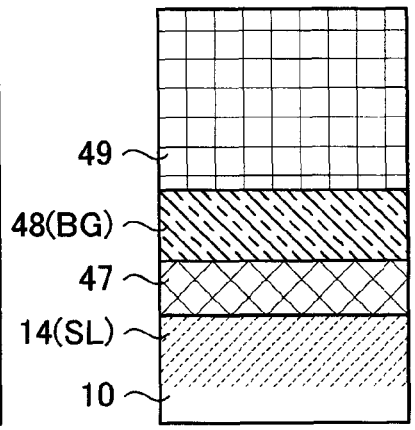
Figure 20C:
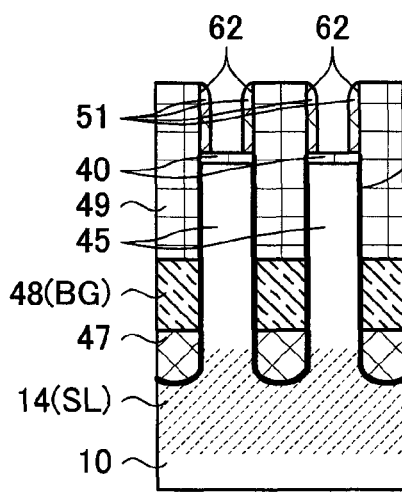
Figure 20D:
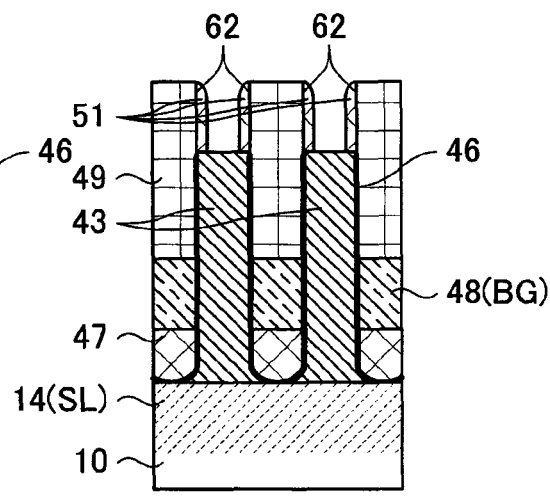
Figure 21:
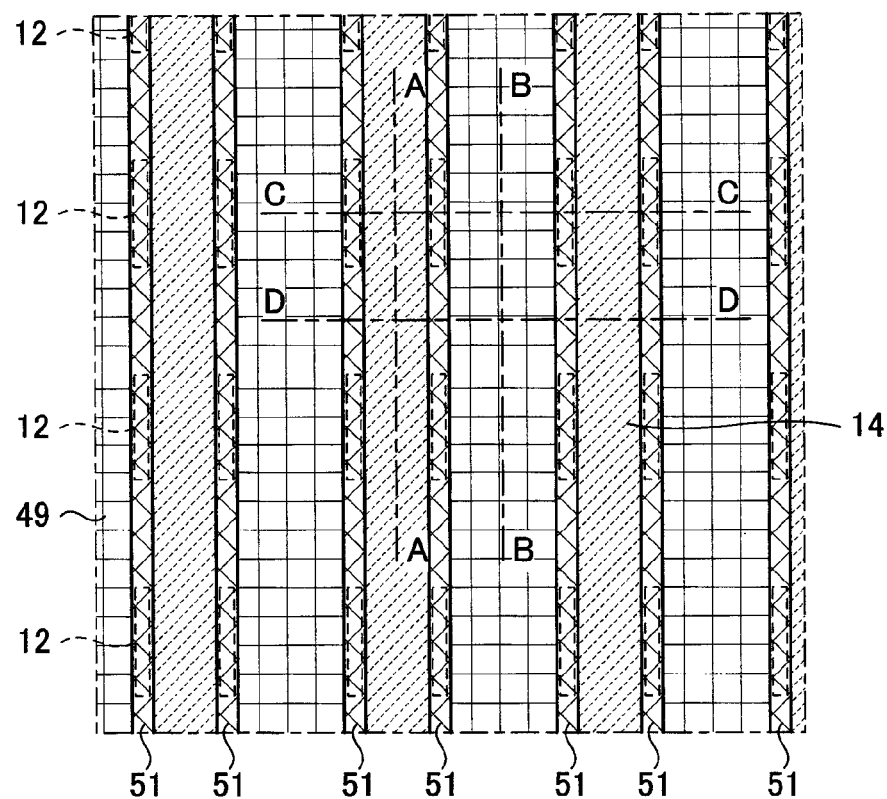
Figure 23:
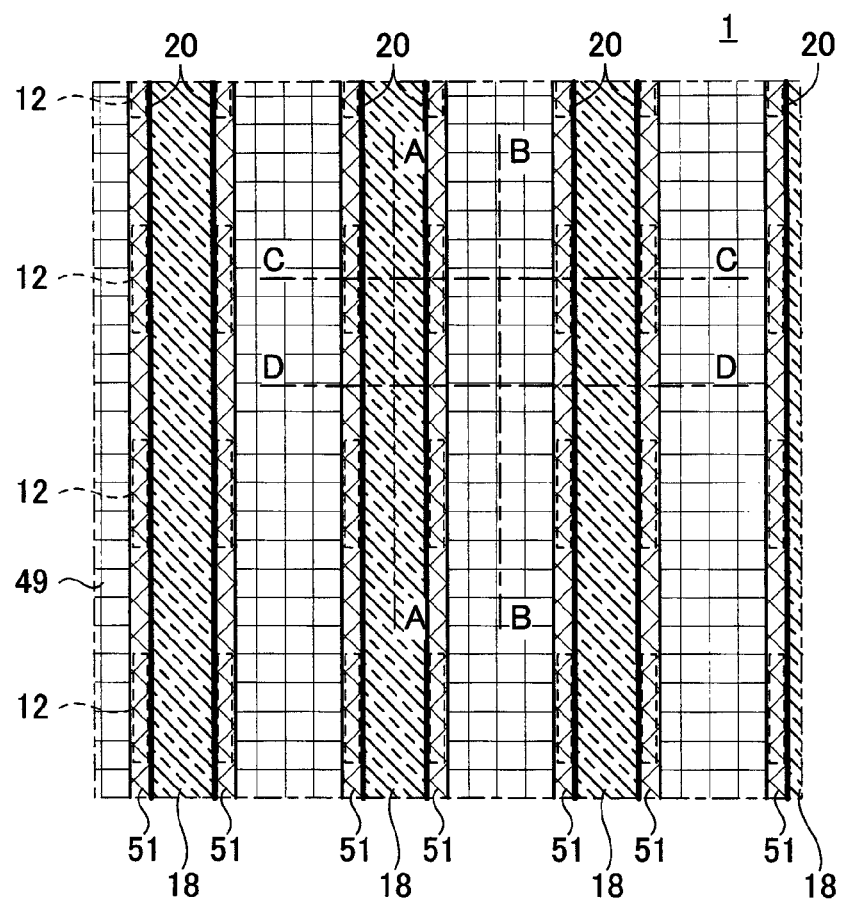
Figure 25:
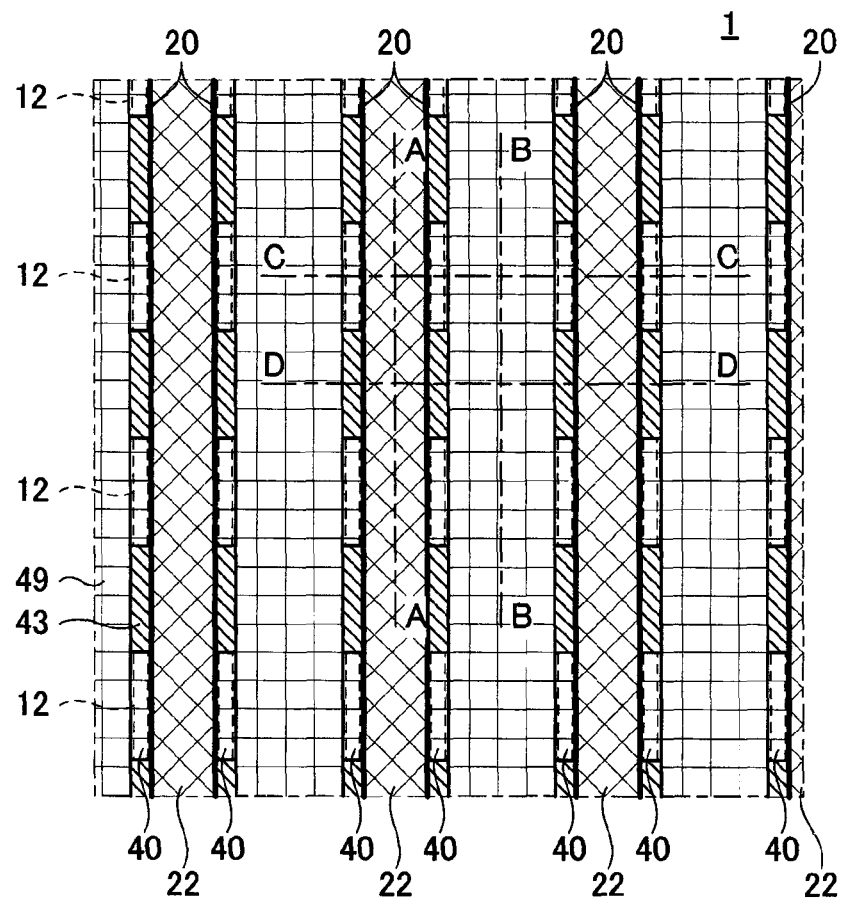
Figure 27:
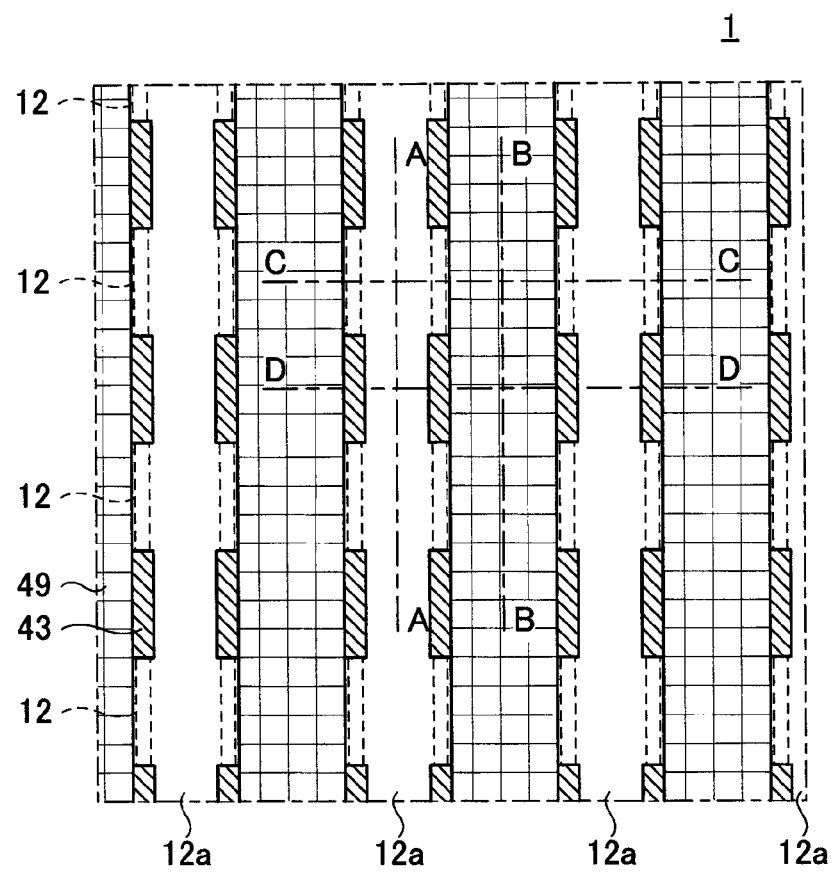
Figure 29:
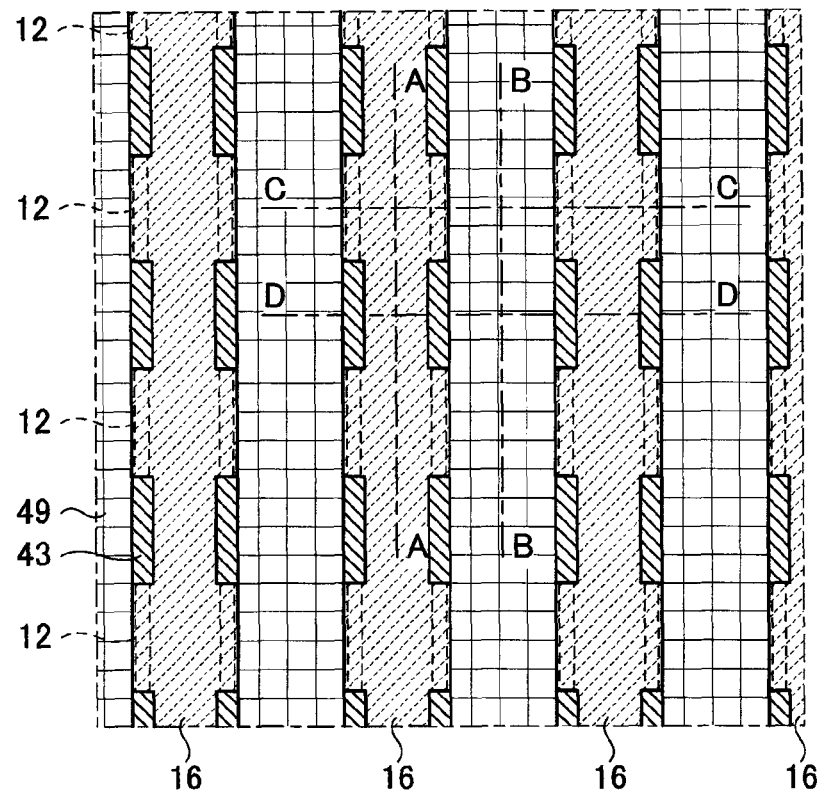
Figure 31:
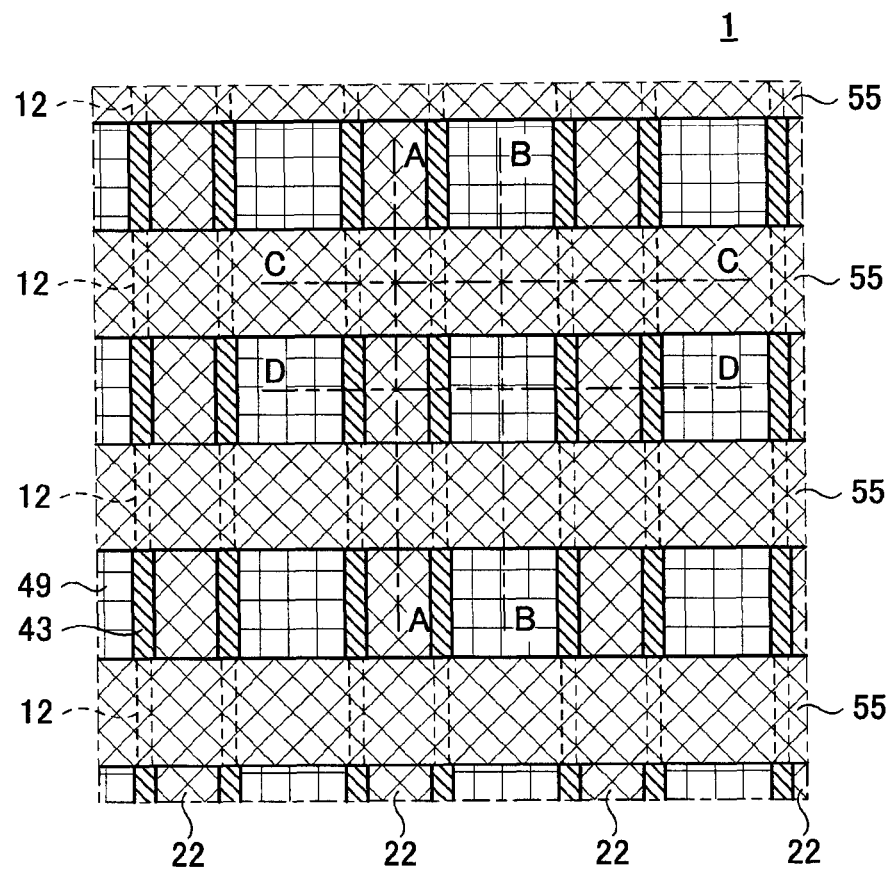
Figure 33A:
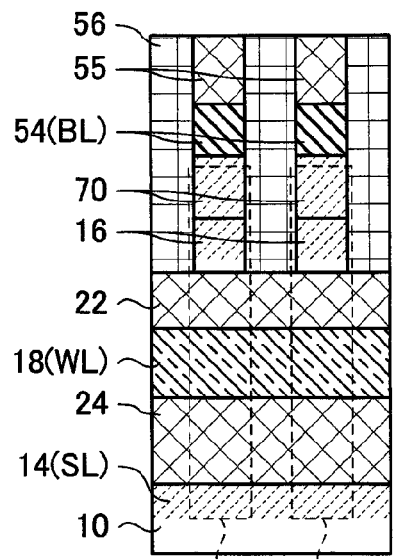
FIGS. 33A to 33D are cross-sectional views of a semiconductor device according to a second embodiment of the present invention and correspond a line A-A, a line B-B, a line C-C, and a line D-D, respectively, of FIG. 1.
Figure 33B:
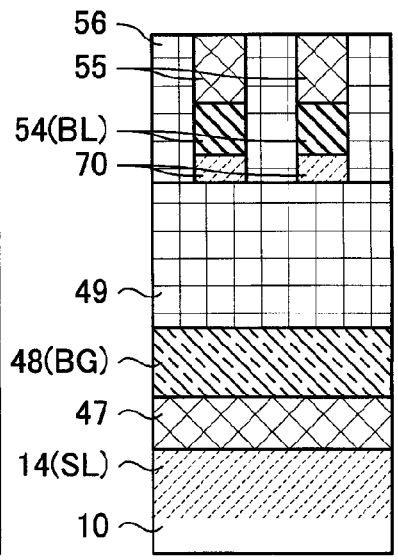
Figure 33C:
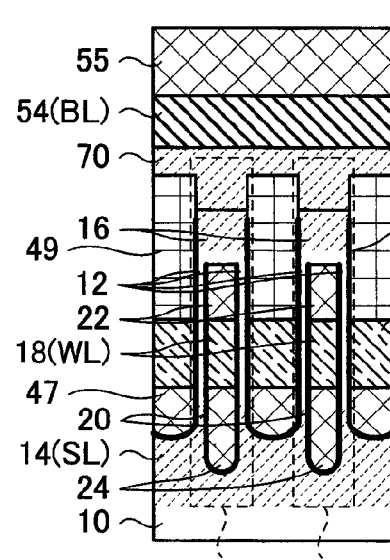
Figure 33D:
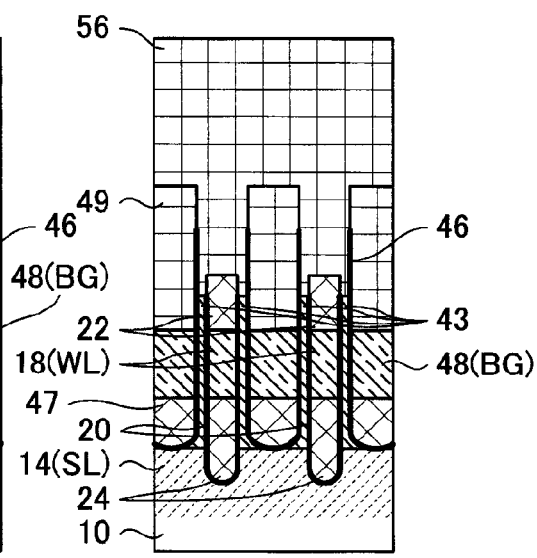

FIG. 4 shows a change in electric potentials of the bit line BL, the word line WL, and the back-gate line BG. FIG. 4 shows a case where data "1" is written and read after a standby mode, and thereafter data "0" is written and read. As shown in FIG. 4, the electric potentials of the bit line BL and the word line WL in the standby mode are 0 Volt (V) and −1.5 V, respectively. When writing the data "1", the electric potentials of the bit line BL and the word WL are changed to 1.2 V and 0.8 V, respectively. The electric potential 1.2 V of the bit line BL corresponds to the data "1". When reading the data "1" thereafter, the electric potentials of the bit line BL and the word line WL are changed to 1.2 V and −0.4 V, respectively. When writing the data "0" thereafter, the electric potentials of the bit line BL and the word line WL are changed to 0 V and 0.8 V, respectively. The electric potential 0 V of the bit line BL corresponds to the data "0". When reading the data "0" thereafter, the electric potentials of the bit line BL and the word line WL are changed to 1.2 V and −0.4 V, respectively.

As shown in FIG. 4, a constant electric potential of −0.5 V is applied to the back-gate line BG. Accordingly, the accumulable charge of the thyristor 11 can be increased as compared to that of a single-gate structure, and as a result, an information retention time, particularly of the data "1", can be nearly doubled. While application of the constant electric potential of −0.5 V is preferable if the back-gate line BG is made of a P-type DOPOS (Doped Poly-Si) film, a constant electric potential of −1.5 V is preferable if the back-gate line BG is made of an N-type DOPOS film.

As explained above, in the semiconductor device 1 according to the first embodiment, because the word line WL is made to penetrate through the silicon pillar 12 in a horizontal direction, a volume of the silicon pillar 12 can be reduced. Therefore, a point defect count in silicon crystals can be reduced as compared to that of the conventional device, and a junction leakage current of the thyristor 11 can be reduced. Consequently, even if the accumulated charge amount in the thyristor 11 is small, adequate information retention characteristics can be secured.

Further, holding characteristics of the thyristor 11 are improved due to the provision of the back-gate line BG adjacent to the silicon pillar 12.

A manufacturing method of the semiconductor device 1 according to the first embodiment is explained next with reference to FIGS. 5 to 32. Among these drawings, each of the drawings of an odd number is that of a plan view of the semiconductor device 1, and the drawings of an even number with a suffix A to D attached thereto are those of cross-sectional views taken along a line A-A, a line B-B, a line C-C, and a line D-D, respectively, of the odd-numbered drawing immediately before it.

First, as shown in FIGS. 5 and 6A to 6D, the silicon substrate 10 is prepared, and on an upper face thereof, a silicon dioxide film 40 of a thickness of about 5 nanometers (nm) is formed by oxidization. The P-type impurities are implanted to form a PWELL (not shown). Thereafter, a silicon nitride film of a thickness of about 60 nm is deposited, and mask patterns 41 (first mask insulating film) that extend along a bit line direction are formed by a field PR (Photo Resist). In the manufacturing method according to the first embodiment, the silicon pillar 12 is formed by a so-called double patterning method. That is, the silicon pillar 12 is formed using two types of mask patterns, that is, the mask patterns 41 that extend along a bit line direction and mask patterns 44 (explained later) that extend along the word line direction.

After forming the mask pattern 41, trenches 60 (third opening) of a depth of 250 nm are formed by dry etching. Because of these trenches 60, wall-shaped silicon pillars 42 that extend in a bit line direction are formed.

Thereafter, the entire surface is subjected to ISSG (In-Situ Steam Generation) oxidation, a thin ISSG oxide film (not shown) of a thickness of about 6 nm is formed on the entire surface including the surface of the mask pattern 41. Next, as shown in FIGS. 7 and 8A to 8D, an undoped polysilicon film 43 (third insulating film) is deposited, filling the trenches 60 with the polysilicon film 43. The polysilicon film 43 is subjected to an etch-back process (oxide film high selective poly-Si dry etching back) until the tops of the mask patterns 41 protrude, as shown in FIGS. 8A and 8B. The polysilicon film 43 is undoped so that the impurities from the polysilicon film 43 do not spreading inside the silicon pillar 12 when the inner wall face of the silicon pillar 12 is oxidized (explained later) for forming the gate dielectric film 20, as well as to make subsequent etching (for forming trenches 61 explained later) easy.

Thereafter, the polysilicon film 43 is subjected to wet etching, and the mask patterns 41 are removed by hot phosphoric acid to planarize the surface as shown in FIGS. 9 and 10A to 10D.

Subsequently, a silicon nitride film of a thickness of about 60 nm is deposited on the planarized surface, and the mask patterns 44 (second mask insulating film) that extend in a word line direction are formed by the field PR (photo resist), as shown in FIGS. 11 and 12A to 12D. Thereafter, dry etching is performed using the mask patterns 44 as a mask, and the resist is peeled off.

Next, the trenches 61 are formed by etching both the silicon and the silicon dioxide film at the same time. At this stage, as shown in FIGS. 13 and 14A to 14D, a silicon pillar 45 is formed at every intersection between the word lines WL and the bit lines BL.

Next, the back-gate dielectric film 46 of a thickness of about 5 nm is formed by thermal oxidation on the surface of the silicon substrate 10 including the side faces of the silicon pillars 45, and thereafter, the N-type impurities are implanted at the bottom of the trenches 61, and the first impurity diffusion layer 14 is formed by annealing, as shown in FIGS. 15 and 16A to 16D. The first impurity diffusion layer 14 can be formed by vapor phase doping. Moreover, the first impurity diffusion layer 14 can be formed after forming a side-wall dielectric film on the side faces of the silicon pillars 45.

Next, as shown in FIGS. 17 and 18A to 18D, the silicon nitride film 47 is deposited to fill around the silicon pillars 45 and the mask patterns 44, and etched back using hot phosphoric acid. After the etch-back process, the thickness of the silicon nitride film 47 is about 50 nm. Furthermore, a DOPOS film that includes approximately $1 \times 10^{20}$ particles/cm$^3$ of the P-type impurities or the N-type impurities is deposited, and the back-gate electrode 48 is formed around the silicon pillars 45 by dry etch-back process. The thickness of the back-gate electrode 48 is about 100 nm. Thereafter, the silicon dioxide film (first insulating film) 49 is deposited up to the height exceeding the upper faces of the mask patterns 44, and the surface is planarized by CMP (Chemical Mechanical Polishing) until surfaces of the mask patterns 44 are exposed.

Next, the oxide film is subjected to wet etching, and the mask patterns 44 are removed using hot phosphoric acid. Thereafter, after the deposition of a thin silicon nitride film, an etch-back process is performed. This leads to formation of a side-wall nitride film 51 of a thickness of about 7 nm inside openings 62 (first openings) formed by the removal of the mask patterns 44, as shown in FIGS. 19 and 20A to 20D.

Next, the side-wall nitride film 51 and the silicon dioxide film 49 are used as masks while etching the silicon pillars 45 and the polysilicon film 43, and as shown in FIGS. 21 and 22A to 22D, trenches 63 (second openings) that penetrate through the silicon pillars 45 in a horizontal direction are formed. The depth of the trench 63 is such that the upper face of the first impurity diffusion layer 14 is exposed without the trench 63 penetrating through the first impurity diffusion layer 14. Specifically, the depth of the trench 63 is preferably 250 nm to 300 nm. In this manner, a portion (other than the top portion) of the silicon pillar 12, which is split into two portions with each portion on either side of the central line in a word line direction, is formed. The thickness of the split portions is preferably less than 5 nm. During this etching, the silicon dioxide film 49 is also etched. Therefore, an etching selectivity and the thickness of the silicon dioxide film 49 should be appropriately adjusted so that the thickness of the silicon dioxide film 49 is adequate enough to serve as insulation between layers even after etching.

Next, the inner walls of the trenches 63 are subjected to oxidation (gate oxidation) to form the gate dielectric film 20 (a film thickness of about 6 nm) shown in FIGS. 23 and 24A to 24D. Thereafter, a deposition and etch-back processes of the silicon nitride film and a deposition and etch-back processes of an N-type DOPOS film are sequentially performed. In this manner, as shown in FIGS. 23 and 24A to 24D, the gate electrodes 18 (the word lines WL) that penetrate through the silicon pillars 12 in a horizontal direction and the insulating film 24 that serves as an insulation between the bottom face of the gate electrode 18 and the silicon substrate 10 as well as the silicon pillars 12 are formed inside the trenches 63. The film thickness of the gate electrode 18 is preferably about 100 nm. The film thickness and the position of the gate electrode 18 in a height direction are preferably equal to the film thickness and the position of the back-gate electrode 48 in a height direction.

Thereafter, a silicon nitride film is further deposited, and an etch-back process is performed with hot phosphoric acid to form the insulating film 22 (second insulating film) to serve as an insulation between the upper face of the gate electrode 18 and the silicon pillar 12, and to remove the side-wall nitride film 51, as shown in FIGS. 25 and 26A to 26D. It is preferable that the thickness of the insulating film 22 is set about 50 nm.

Next, after removing the silicon dioxide film 40 and the exposed portion of the gate dielectric film 20, a top portion 12a is formed by extending the silicon pillar 12 upward, as shown in FIGS. 27 and 28A to 28D. Specifically, using the exposed portion of the silicon pillar 12 of the inner wall of the trench 63, single-crystal silicon is grown by selective epitaxy. The second impurity diffusion layer 16 is formed inside the top portion 12a, as shown in FIGS. 29 and 30A to 30D, by implanting the N-type impurities and performing annealing.

After forming the second impurity diffusion layer 16, non-doped amorphous silicon is deposited over the entire surface, and the third impurity diffusion layer 17 is formed, as shown in FIGS. 32A to 32D, by implanting P-type impurity ions. Thereafter, the laminated film 54 made of tungsten nitride (WN) and tungsten (W) is formed over the third impurity diffusion layer 17, and after deposition of a silicon nitride film thereon, bit line patterns 55 are formed.

After the mask patterns 55 are formed, the laminated film 54, the third impurity diffusion layer 17, and the second impurity diffusion layer 16 are sequentially etched by dry etching, and as shown in FIGS. 31 and 32A to 32D, the laminated film 54, the third impurity diffusion layer 17, and the second impurity diffusion layer 16 are separated for every bit line BL. It is preferable that the second impurity diffusion layer 16 formed in the areas between the bit lines BL (FIG. 30D) be completely removed by over-etching.

As explained above, in the manufacturing method of the semiconductor device 1 according to the first embodiment without having any capacitors in the memory cells, the word lines WL can be made to penetrate through the silicon pillars 12 in a horizontal direction, and the back-gate lines BG can be formed adjacent to the silicon pillars 12. Furthermore, because selective epitaxial growth is used for forming the top portion 12a of the silicon pillar 12, a rise in a contact resistance can be suppressed.

FIGS. 33A to 33D are cross-sectional views of the semiconductor device 1 according to a second embodiment of the present invention. A plan view of the semiconductor device 1 according to the second embodiment is identical to that of the semiconductor device 1 according to the first embodiment shown in FIG. 1. FIGS. 33A to 33D correspond to cross-sectional views taken along the lines A-A, the line B-B, the line C-C, and the line D-D, respectively, of FIG. 1.

The semiconductor device 1 according to the second embodiment differs from the semiconductor device 1 according to the first embodiment in that it includes an identically-shaped impurity diffusion layer 70 instead of the third impurity diffusion layer 17. The impurity diffusion layer 70 is of the same conductivity type (N-type) as the impurity diffusion layer 16. In the second embodiment, the impurity diffusion layer 16 and the impurity diffusion layer 70 are integrated to form a second impurity diffusion layer. With this configuration, a device that is formed in the silicon pillar 12 of the semiconductor device 1 according to the second embodiment is an N-channel MOS transistor 71 and not the thyristor 11. Similarly to the thyristor 11, the MOS transistor 71 is a double-gate transistor. Furthermore, the semiconductor device 1 according to the second embodiment can be manufactured using the same manufacturing method as for the semiconductor device 1 according to the first embodiment.

Figure 34:
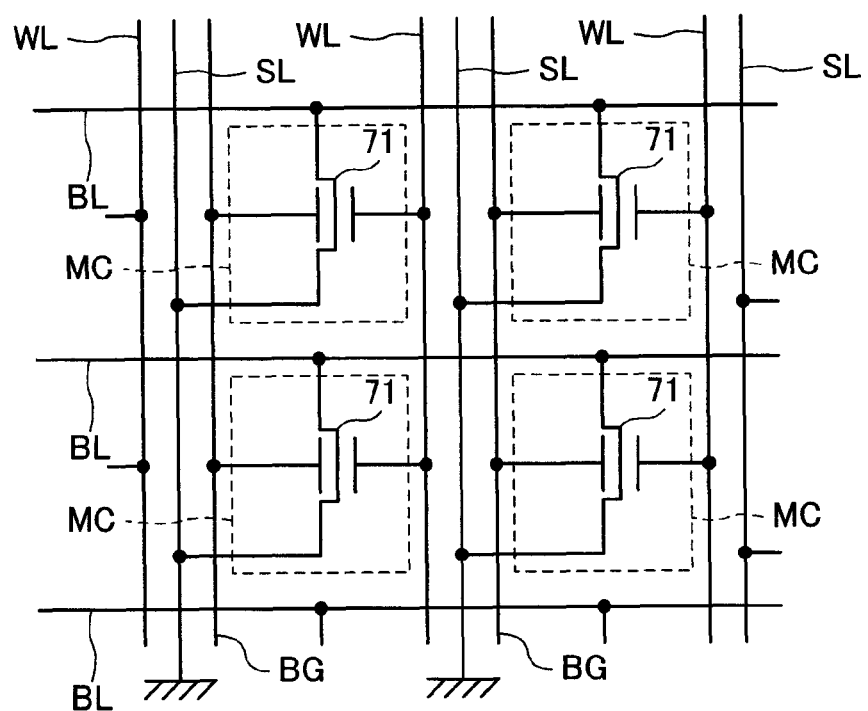
FIG. 34 is an equivalent circuit diagram of the semiconductor device according to the second embodiment of the present invention.

FIG. 34 is an equivalent circuit diagram of the semiconductor device 1 according to the second embodiment. However, only four memory cells have been shown exposed in FIG. 34. The semiconductor device 1 according to the second embodiment includes four types of wirings, that is, the word lines WL, the bit lines BL, the back-gate lines BG, and the source lines SL, and has a memory cell that includes the MOS transistor 71 at each intersection between the word lines WL and the bit lines BL. The bit line BL is connected to one controlled electrode of the MOS transistor 71 and the source line SL is connected to other controlled electrode of the MOS transistor 71. The source line SL is connected to the ground. The word line WL and the back-gate line BG form a gate electrode and a back-gate electrode, respectively, of the MOS transistor 71 that are of a double-gate type.

According to the above configuration, by a combination of voltages applied to the word line WL and the bit line BL, electric charge can be made to accumulate in or accumulated electric charge amount can be read from the P-type impurity diffusion layer that is second from the bottom (an area in the middle of the silicon pillar 12) in the MOS transistor 71 within a specific memory cell. That is, writing to and reading from the MOS transistor 71 can be performed.

Figure 35:
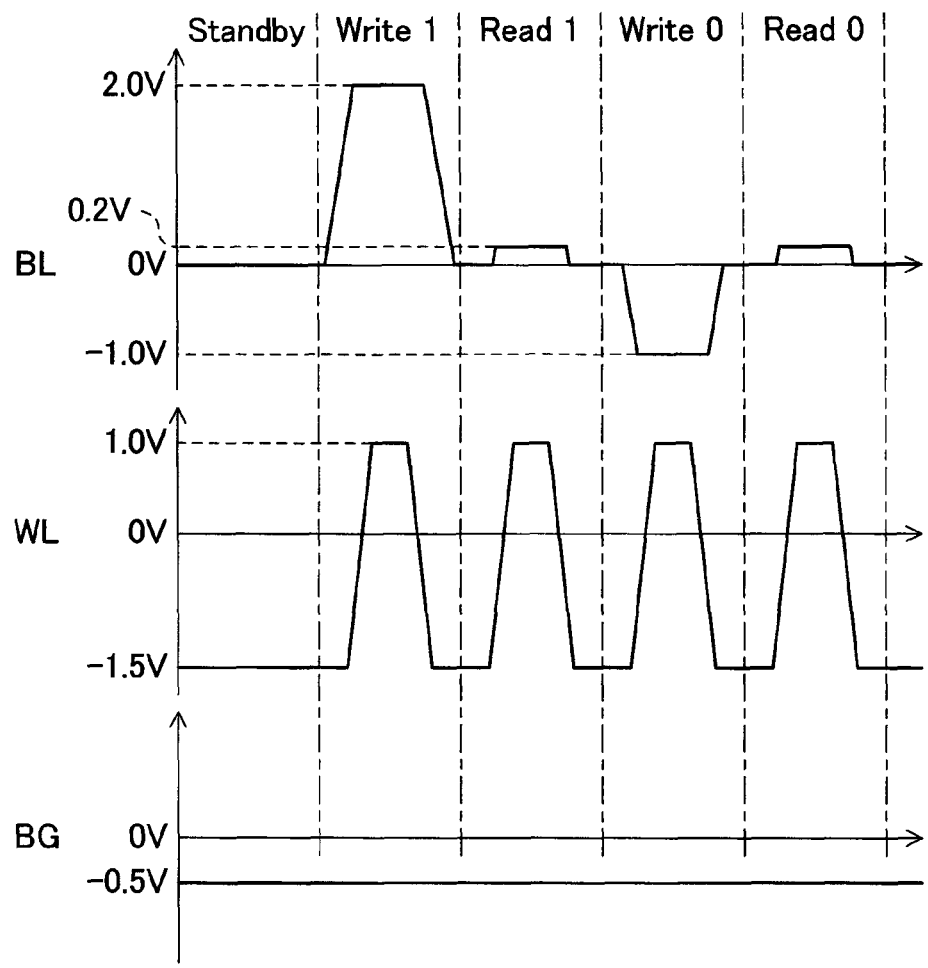
FIG. 35 shows a change in electric potentials of the bit line BL, the word line WL, and the back-gate line BG according to the second embodiment of the present invention.

FIG. 35 shows a change in electric potentials of the bit line BL, the word line WL, and the back-gate line BG, and shows a case where data "1" is written and read from a standby mode, and thereafter data "0" is written and read. As shown in FIG. 35, the electric potentials of the bit line BL and the word line WL in the standby mode are 0 V and −1.5 V, respectively. When writing the data "1", the electric potentials of the bit line BL and the word line WL are changed to 2.0 V and 1.0 V, respectively. The electric potential 2.0 V of the bit line BL corresponds to the data "1". When reading the data "1" thereafter, the electric potentials of the bit line BL and the word line WL are changed to 0.2 V and 1.0 V, respectively. When writing the data "0" thereafter, the electric potentials of the bit line BL and the word line WL are changed to −1.0 V and 1.0 V, respectively. The electric potential −1.0 V of the bit line BL corresponds to the data When reading the data "0" thereafter, the electric potentials of the bit line BL and the word line WL are changed to 0.2 V and 1.0 V, respectively.

As shown in FIG. 35, a constant electric potential of −0.5 V is applied to the back-gate line BG. Herewith, the accumulable charge of the MOS transistor 71 can be increased as compared to that of a single-gate structure, and as a result, an information retention time can be increased. Similarly to the first embodiment, application of the constant electric potential of −0.5 V is preferable if the back-gate line BG is made of a P-type DOPOS film, a constant electric potential of −1.5 V is preferable if the back-gate line BG is made of an N-type DOPOS film.

As explained above, in the semiconductor device 1 according to the second embodiment, because the word line WL is made to penetrate through the silicon pillar 12 in a horizontal direction, a volume of the silicon pillar 12 can be reduced. Thus, a point defect count in silicon crystals can be reduced as compared to that of the conventional device, and a junction leakage current of the MOS transistor 71 can be reduced. Consequently, even if the accumulated charge amount in the MOS transistor 71 is small, adequate information retention characteristics can be secured.

In addition, holding characteristics of the MOS transistor 71 are improved due to the provision of the back-gate line BG adjacent to the silicon pillar 12.

It is apparent that the present invention is not limited to the above embodiments, but may be modified and changed without departing from the scope and spirit of the invention.

For example, while the semiconductor device 1 has been explained as a DRAM in the above embodiments, the present invention can be also applicable to other types of semiconductor devices such as a PRAM (Phase change Random Access Memory).

In the above explanations, the conductivity types of the semiconductor devices 1 according to the first and second embodiments are assumed to be N-type and P-type, respectively. However, the conductivity types of the first and second embodiments can be switched. The semiconductor device 1 according to the first embodiment, for example, can be formed inside an N-type area NWELL arranged on the surface of the silicon substrate 10 and above thereof, with the first impurity diffusion layer 14 and the second impurity diffusion layer 16 being the impurity diffusion layers of the P-type, and the third impurity diffusion layer 17 being the impurity diffusion layer of the N-type.

In addition, while not specifically claimed in the claim section, the applicant reserves the right to include in the claim section of the application at any appropriate time the following methods:

A1. A manufacturing method of a semiconductor device, comprising:
forming a silicon pillar by etching a silicon substrate using a mask insulating film;
forming a back-gate dielectric film by oxidizing a side surface of the silicon pillar;
forming a first impurity diffusion layer below the silicon pillar;
forming a back-gate electrode, with at least a topside thereof covered by a first insulating film, around the silicon pillar;
removing the mask insulating film;
forming a side-wall dielectric film on an inner wall of a first opening formed by removing the mask insulating film;
etching the silicon pillar using the side-wall dielectric film and the first insulating film as masks;
forming a gate dielectric film by oxidizing an inner wall of a second opening formed by etching the silicon pillar;
forming a gate electrode, with at least a topside thereof covered by a second insulating film, inside the second opening; and
forming a second impurity diffusion layer in contact with a top of the silicon pillar and a top of the second insulating film.

A2. The manufacturing method of a semiconductor device in A1, wherein
the forming the second impurity diffusion layer includes,
growing silicon in contact with a top of the silicon pillar and a top of the second insulating film by selective epitaxial growth, and
implanting impurities into the silicon.

A3. The manufacturing method of a semiconductor device in A1, further comprising:
forming a third impurity diffusion layer in contact with a top of the second impurity diffusion layer; and
forming a wiring pattern in contact with a top of the third impurity diffusion layer, wherein
the first impurity diffusion layer and the second impurity diffusion layer are formed of silicon and impurities of a first conductivity type implanted into the silicon, and
the third impurity diffusion layer is formed of silicon and impurities of a second conductivity type implanted into the silicon.

A4. The manufacturing method of a semiconductor device in A1, further comprising forming a wiring pattern in contact with a top of the second impurity diffusion layer, wherein
the first impurity diffusion layer and the second impurity diffusion layer are formed of silicon and impurities of a first conductivity type implanted into the silicon.

A5. The manufacturing method of a semiconductor device in A3, wherein
the semiconductor device is a semiconductor memory device using a word line and a bit line that are mutually orthogonal and a back-gate line that is parallel to the word line, and the gate electrode, the back-gate electrode, and the wiring pattern form the word line, the back-gate line, and the bit line, respectively, and wherein the forming the silicon pillar includes, etching the silicon substrate using a first mask insulating film that extends in a bit line direction, forming a third insulating film to fill an inside of a third opening formed by the etching of the silicon substrate, removing the first mask insulating film and forming a second mask insulating film that extends in a word line direction, and forming the silicon pillar by etching the silicon substrate and the third insulating film by using the second mask insulating film.

A6. The manufacturing method of a semiconductor device in A4, wherein the semiconductor device is a semiconductor memory device using a word line and a bit line that are mutually orthogonal and a back-gate line that is parallel to the word line, and the gate electrode, the back-gate electrode, and the wiring pattern form the word line, the back-gate line, and the bit line, respectively, and wherein the forming the silicon pillar includes, etching the silicon substrate using a first mask insulating film that extends in a bit line direction, forming a third insulating film to fill an inside of a third opening formed by the etching of the silicon substrate, removing the first mask insulating film and forming a second mask insulating film that extends in a word line direction, and forming the silicon pillar by etching the silicon substrate and the third insulating film by using the second mask insulating film.

A7. The manufacturing method of a semiconductor device in A1, wherein the silicon pillar is formed in plural in matrix.

What is claimed is:

1. A semiconductor device comprising:
   a silicon pillar projecting to substantially perpendicular to a principal surface of a substrate;
   a first impurity diffusion layer arranged a lower part of the silicon pillar;
   a second impurity diffusion layer arranged an upper part of the silicon pillar;
   a gate electrode that penetrates through the silicon pillar in a direction substantially parallel to the principal surface of the substrate;
   a gate dielectric film arranged between the gate electrode and the silicon pillar;
   a back-gate electrode arranged adjacent to the silicon pillar; and
   a back-gate dielectric film arranged between the back-gate electrode and the silicon pillar.

2. The semiconductor device as claimed in claim 1, further comprising a third impurity diffusion layer arranged in contact with a top of the second impurity diffusion layer, wherein
   the first and second impurity diffusion layers have a first conductivity type, and
   the third impurity diffusion layer has a second conductivity type.

3. The semiconductor device as claimed in claim 2, wherein
   the semiconductor device is a semiconductor memory device having a word line and a bit line that are mutually orthogonal and a back-gate line that is parallel to the word line,
   the silicon pillar is formed in plural in matrix,
   the gate electrode penetrates through the silicon pillars arranged in a word line direction to form the word line,
   the back-gate electrode is arranged adjacent to the silicon pillars arranged in the word line direction to form the back-gate line, and
   the third impurity diffusion layer is arranged commonly to the silicon pillars arranged in a bit line direction to form the bit line.

4. The semiconductor device as claimed in claim 1, wherein the first and second impurity diffusion layers have a first conductivity type.

5. The semiconductor device as claimed in claim 4, wherein
   the semiconductor device is a semiconductor memory device using a word line and a bit line that are mutually orthogonal and a back-gate line that is parallel to the word line,
   the silicon pillar is formed in plural in matrix,
   the gate electrode penetrates through the silicon pillars arranged in a word line direction to form the word line,
   the back-gate electrode is arranged adjacent to the silicon pillars arranged in the word line direction to form the back-gate line, and
   the second impurity diffusion layer is arranged commonly to the silicon pillars arranged in a bit line direction to form the bit line.

* * * * *